United States Patent
Ochi et al.

(10) Patent No.: US 10,559,772 B2
(45) Date of Patent: Feb. 11, 2020

(54) DISPLAY DEVICE AND PRODUCTION METHOD THEREOF

(71) Applicant: Sharp Kabushiki Kaisha, Sakai, Osaka (JP)

(72) Inventors: Hisao Ochi, Sakai (JP); Jumpei Takahashi, Sakai (JP); Tohru Senoo, Sakai (JP); Takashi Ochi, Sakai (JP); Tohru Sonoda, Sakai (JP); Takeshi Hirase, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 66 days.

(21) Appl. No.: 16/068,913

(22) PCT Filed: Mar. 31, 2017

(86) PCT No.: PCT/JP2017/013512
§ 371 (c)(1),
(2) Date: Jul. 10, 2018

(87) PCT Pub. No.: WO2018/179308
PCT Pub. Date: Oct. 4, 2018

(65) Prior Publication Data
US 2019/0363275 A1  Nov. 28, 2019

(51) Int. Cl.
| H01L 51/50 | (2006.01) |
| H01L 27/32 | (2006.01) |
| H05B 33/06 | (2006.01) |
| H05B 33/04 | (2006.01) |
| G09F 9/30 | (2006.01) |
| H01J 37/28 | (2006.01) |

(52) U.S. Cl.
CPC .......... *H01L 51/5036* (2013.01); *G09F 9/301* (2013.01); *H01L 27/3211* (2013.01); *H05B 33/04* (2013.01); *H05B 33/06* (2013.01); *H01J 37/28* (2013.01); *H01L 27/3241* (2013.01)

(58) Field of Classification Search
None
See application file for complete search history.

(56) References Cited

U.S. PATENT DOCUMENTS

| 9,391,296 B2 | 7/2016 | Park et al. | |
| 2003/0168966 A1* | 9/2003 | Kobayashi | H01L 27/3246 313/495 |
| 2013/0271714 A1* | 10/2013 | Hirota | G02F 1/1339 349/139 |

(Continued)

FOREIGN PATENT DOCUMENTS

| JP | 2012-3989 A | 1/2012 |
| JP | 2013-97918 A | 5/2013 |

OTHER PUBLICATIONS

Official Communication issued in International Patent Application No. PCT/JP2017/013512, dated Jun. 27, 2017.

*Primary Examiner* — Alexander G Ghyka
(74) *Attorney, Agent, or Firm* — Keating & Bennett, LLP

(57) ABSTRACT

An organic EL display device includes, as an organic layer stopper defining edges of an organic layer, a frame-shaped bank surrounding a display region. An upper face of the bank includes recessed portions and protrusions including a plurality of protrusions, and upper faces of the protrusions includes planar portions.

17 Claims, 15 Drawing Sheets

(56) References Cited

U.S. PATENT DOCUMENTS

| | | | |
|---|---|---|---|
| 2016/0095172 A1* | 3/2016 | Lee | C23C 16/401 |
| | | | 313/504 |
| 2016/0204373 A1 | 7/2016 | Park | |
| 2016/0334656 A1* | 11/2016 | Senokuchi | G02F 1/1339 |
| 2018/0233541 A1* | 8/2018 | Zeng | G06F 3/0412 |
| 2019/0252639 A1* | 8/2019 | Lee | G06F 3/0412 |
| 2019/0326375 A1* | 10/2019 | Ochi | H05B 33/10 |

\* cited by examiner

DISPLAY DEVICE AND PRODUCTION METHOD THEREOF

TECHNICAL FIELD

The disclosure relates to a display device and to a production method thereof.

BACKGROUND ART

An EL display device that uses the Electro luminescence (hereinafter referred to as "EL") of a luminescent material is gathering attention as a display device offering a faster response speed in comparison to a liquid crystal display device, and also having a wider viewing angle.

This type of display device has a configuration including, for example, a TFT substrate formed by thin film transistors (TFTs) provided on a support body, which is formed by a glass substrate and the like, and a plurality of light emitting elements, such as organic EL (OLED) elements, connected to the TFTs.

However, in general, this type of light emitting element is susceptible to the influence of moisture, oxygen and the like, and the characteristics thereof deteriorate due to a reaction to small amounts of moisture, oxygen or the like, thus impairing the life of the display device.

Here, to prevent the infiltration of moisture or oxygen into the light emitting element, for example, Thin Film Encapsulation (TFE) technology is known for encapsulating the light emitting element by forming a sealing film in which inorganic layers and organic layers are alternately layered (see PTL 1, for example).

The inorganic layer has a moisture-proof function to prevent the infiltration of moisture and functions as a barrier layer. Meanwhile, the organic layer is used as a buffer layer (a stress relief layer) and mainly performs stress relief of the inorganic layer, and leveling by burying steps in the surface of a light emitting element layer including the light emitting elements, in a display region.

The film formation of the inorganic layer is performed, for example, by Chemical Vapor Deposition (CVD), vacuum vapor deposition, sputtering, or the like.

On the other hand, the organic layer is formed, for example, by an ink-jet method, in which a liquid organic material is applied to the display region, and the liquid organic material is then cured.

However, in a case where wet-spreading of the liquid organic material is large, the organic layer is exposed to the outside. This may lead to such a deterioration in the reliability of the display device that moisture or the like infiltrates from an exposed surface of the organic layer, a connection defect arises because of terminals covered by the organic layer, and the like.

Here, as disclosed in PTL 1, for example, as an organic layer stopper, a plurality of frame-shaped banks, which regulate the wet-spreading of the liquid organic material, are formed outside of a flattening film that covers the TFTs, surrounding the display region as multiple banks.

In PTL 1, it is disclosed that a stopper pattern, which functions as the organic layer stopper and is formed of protrusions, is provided in triple banks, for example, so as to surround a first control pattern and a second control pattern that surround the display region.

CITATION LIST

Patent Literature

PTL 1: JP 2012-3989 A (published Jan. 5, 2012)

SUMMARY

Technical Problem

Although the greater the number of this type of frame-shaped bank (protrusion) used as the organic layer stopper the more reliably the organic material can be held back, on the other hand, the larger an installation area of the banks becomes, thus becoming an obstacle to frame narrowing.

Note that, in PTL 1, it is also disclosed that only one of the stopper pattern (protrusion) can be provided, depending on a combination of the above-described first control pattern and second control pattern.

However, the liquid organic material concentrates in corner portions of the frame-shaped bank facing corner portions of the display region, as a result of the liquid organic material flowing into each of the corner portions in directions from positions around each of the corner portions toward each of the corner portions. Thus, in a case where a width between the corner portions of the frame-shaped banks narrow, the liquid organic material easily overflows at the corner portions.

In a case where only one of the protrusions is provided, once the organic material flows over the protrusion, the liquid organic material cannot be held back.

In light of the foregoing, an object of the disclosure is to provide a display device and a production method thereof in which the number of locations capable of holding back a liquid organic material is increased, and the liquid organic material is more reliably held back, while an area of an installation region of a bank functioning as an organic layer stopper can be reduced, and frame narrowing can be achieved.

Solution to Problem

To solve the above-described problem, a display device according to a first aspect of the disclosure includes: a plurality of optical elements; a sealing film sealing the plurality of optical elements and including a first inorganic layer, a second inorganic layer, and an organic layer provided between the first inorganic layer and the second inorganic layer; and at least one organic layer stopper formed from a frame-shaped bank surrounding a display region on which the plurality of optical elements are provided, and defining edges of the organic layer. The at least one organic layer stopper includes an organic layer stopper including recessed portions and protrusions on an upper face of the organic layer stopper, the recessed portions and protrusions including a plurality of protrusions, each including a planar portion on an upper face of each of the plurality of protrusions.

To solve the above-described problem, a display device according to a first aspect of the disclosure includes: a plurality of optical elements; a sealing film sealing the plurality of optical elements and including a first inorganic layer, a second inorganic layer, and an organic layer provided between the first inorganic layer and the second inorganic layer; and at least one organic layer stopper formed from a frame-shaped bank surrounding a display region on which the plurality of optical elements are provided and defining edges of the organic layer. The at least one organic layer stopper includes an organic layer stopper including a first frame portion surrounding the display region in a plan view and including a plurality of corner portions, and a second frame portion contiguous to the first frame portion, surrounding each of the plurality of corner portions of the first frame portion, and protruding from the first frame portion at the plurality of corner portions of the first frame portion with a space between the second frame portion and each of the plurality of corner portions of the first frame portion.

To solve the above-described problem, a method for producing a display device according to a first aspect of the disclosure is a method for producing a display device including a plurality of optical elements, and a sealing film sealing the plurality of optical elements and including a first inorganic layer, a second inorganic layer, and an organic layer provided between the first inorganic layer and the second inorganic layer. The method includes: forming, as an organic layer stopper defining edges of the organic layer, at least one frame-shaped bank surrounding a display region on which the plurality of optical elements are provided and including recessed portions and protrusions on an upper face of the at least one frame-shaped bank, the recessed portions and protrusions including a plurality of protrusions, each including a planar portion on an upper face of each of the plurality of protrusions, to hold back a liquid organic material that becomes the organic layer, using the at least one frame-shaped bank.

To solve the above-described problem, a method for producing a display device according to a first aspect of the disclosure is a method for producing a display device including a plurality of optical elements, and a sealing film sealing the plurality of optical elements and including a first inorganic layer, a second inorganic layer, and an organic layer provided between the first inorganic layer and the second inorganic layer. The method includes: forming, as an organic layer stopper defining edges of the organic layer, at least one polygonal frame-shaped bank including corner portions, only the corner portions being formed in a double-frame shape, each of the corner portions including a first frame portion surrounding, in a plan view, a display region on which the plurality of optical elements are provided and including a plurality of corner portions, and a second frame portion contiguous to the first frame portion, surrounding each of the plurality of corner portions of the first frame portion, and protruding from the first frame portion at the plurality of corner portions of the first frame portion with a space between the second frame portion and each of the plurality of corner portions of the first frame portion, to hold back a liquid organic material that becomes the organic layer, using the at least one polygonal frame-shaped bank.

Advantageous Effects of Invention

According to the first aspect of the disclosure, a display device and a production method thereof can be provided in which the number of locations capable of holding back a liquid organic material is increased, and the liquid organic material is more reliably held back, while an area of an installation region of a bank functioning as an organic layer stopper can be reduced, and frame narrowing can be achieved.

DESCRIPTION OF EMBODIMENTS

A detailed description follows regarding embodiments of the disclosure.

First Embodiment

A description follows regarding an embodiment of the disclosure, on the basis of FIGS. 1 to 7.

Note that, in the following description, as an example of a display device according to the present embodiment, an example is given of an organic EL display device provided with an Organic Light Emitting Diode (OLED) layer including OLED elements, known as organic EL elements, as light emitting elements (optical elements).

Schematic Configuration of Organic EL Display Device

Figure 1:
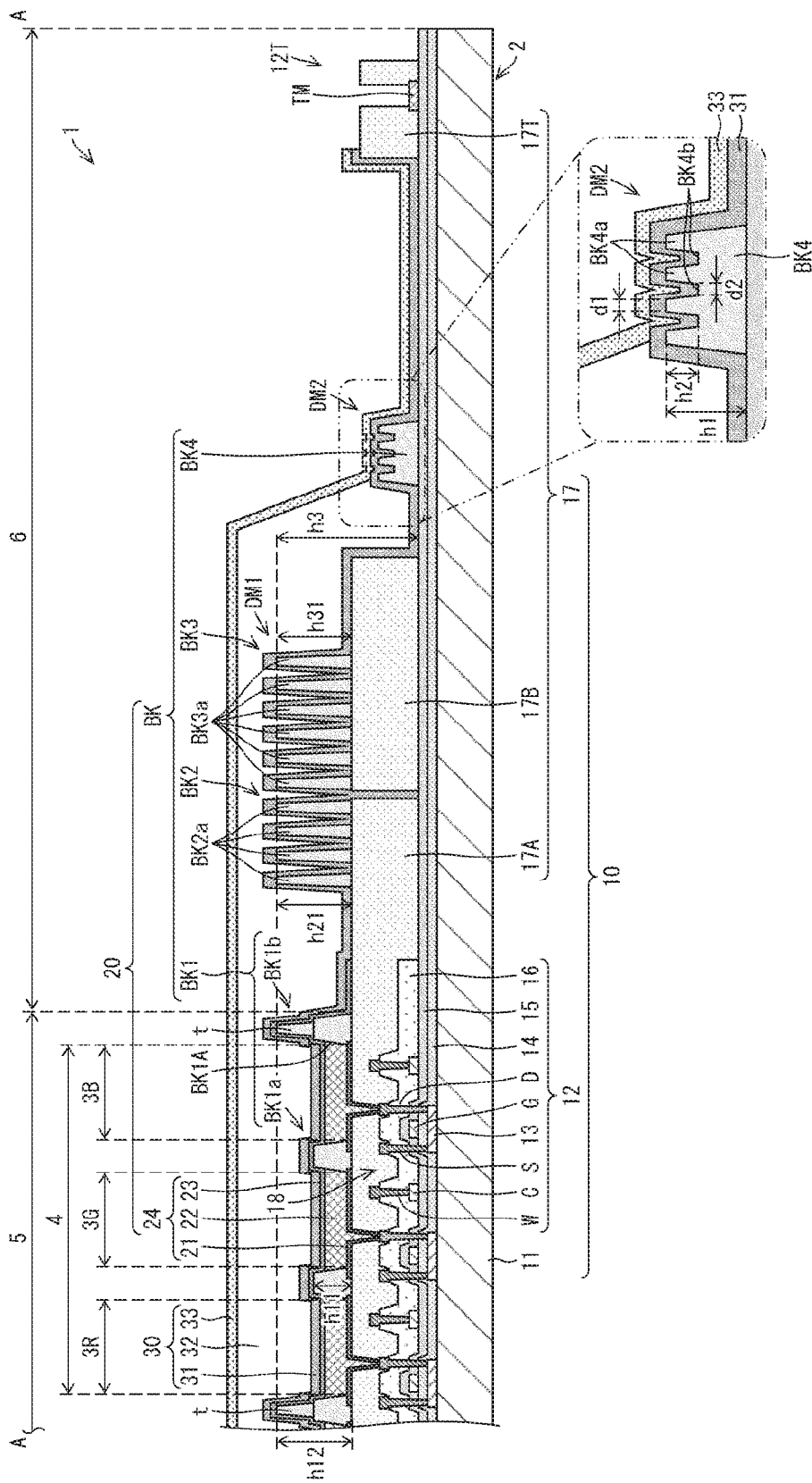
FIG. 1 is a cross-sectional view illustrating an example of a schematic configuration of main portions of an organic EL display device according to a first embodiment of the disclosure.
Figure 2:
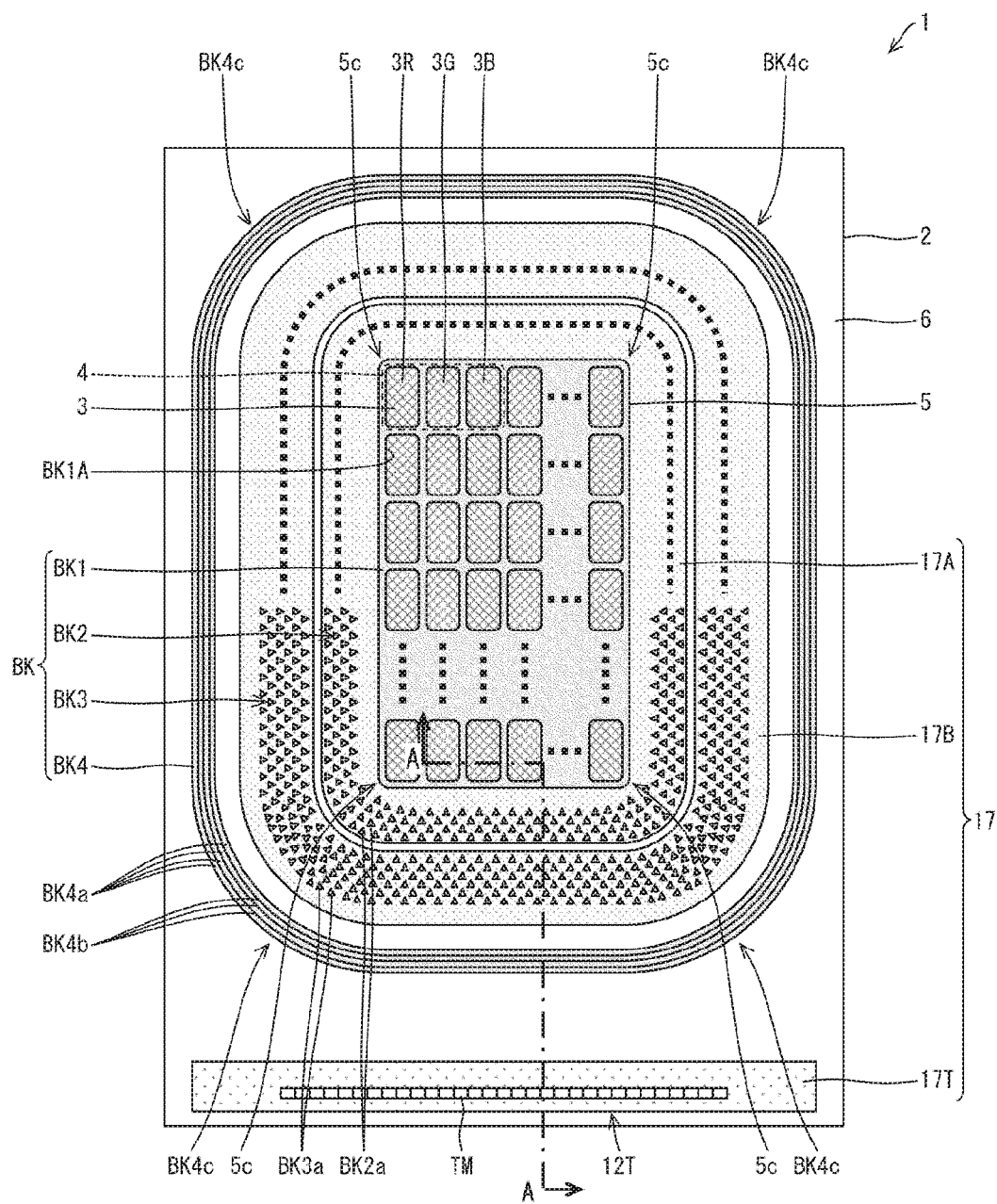
FIG. 2 is a plan view illustrating a schematic configuration of main portions of the organic EL display device according to the first embodiment of the disclosure.
Figure 3:
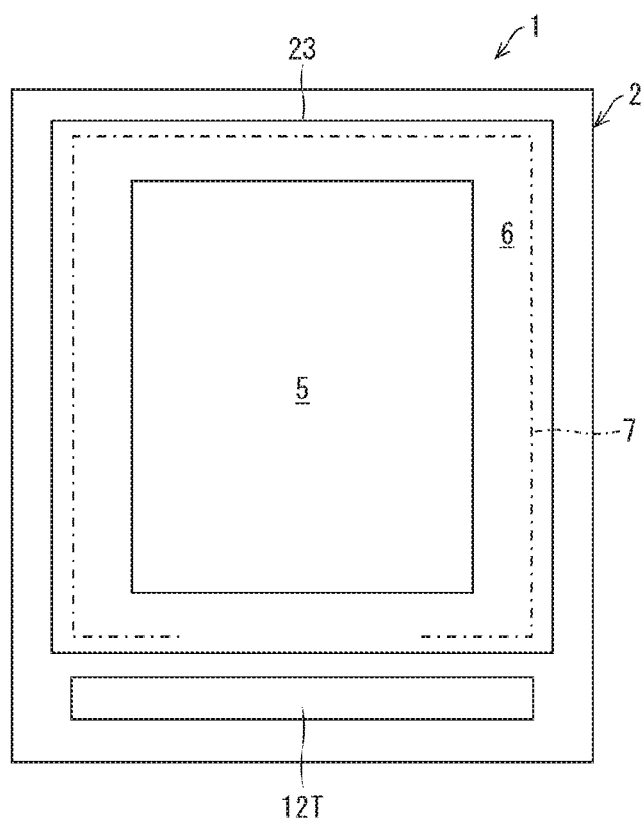
FIG. 3 is a plan view illustrating a layout of a second electrode connecting portion of the organic EL display device according to the first embodiment of the disclosure.

FIG. 1 is a cross-sectional view illustrating an example of a schematic configuration of main portions of an organic EL display device 1 according to the present embodiment. FIG. 2 is a plan view illustrating a schematic configuration of main portions of the organic EL display device 1 according to the present embodiment. FIG. 3 is a plan view illustrating a layout of a second electrode connecting portion 7 of the organic EL display device 1 according to the present embodiment.

Note that FIG. 1 corresponds to a cross-sectional view seen in the direction of arrows on a line A-A in FIG. 2. In FIG. 2, for ease of illustration, apart from banks BK1 to BK4, an organic insulating layer 17, and a terminal portion 12T on which are provided a plurality of terminals TM that are terminals of each of wiring lines, illustration of other portions is omitted. Furthermore, in FIG. 2, for ease of illustration, a ratio of a frame region 6 with respect to a display region 5 is illustrated as being larger than in actuality.

As illustrated in FIG. 1, the organic EL display device 1 is provided with an organic EL substrate 2, and a drive circuit (not illustrated).

The organic EL substrate 2 has a configuration in which an OLED layer 20 configuring an OLED element (an organic EL element), a sealing film 30, and a cover body (not illustrated) are provided on a Thin Film Transistor (TFT) substrate 10, in that order from the TFT substrate 10 side.

Note that the organic EL display device 1 may be a flexible display device that has flexibility and can be folded, or may be a non-foldable display device that has rigidity.

TFT Substrate 10

The TFT substrate 10 is provided with an electrically insulating support body 11, and a TFT layer 12 provided on the support body 11.

Support Body 11

Examples of the support body 11 include a glass substrate, a plastic substrate, or a plastic film. Note that the support body 11 may be a flexible layered film in which a barrier layer (a moisture-proof layer) is provided on a plastic film (a resin layer). Furthermore, the layered film may have a configuration in which, on a face opposite to the face of the plastic film on which the barrier layer is provided, a lower face film that faces the outside is provided, with an adhesive layer interposed therebetween.

A polyimide, polyethylene, a polyamide or the like can be the resin used in the plastic film (resin layer), for example.

The barrier layer is a layer for preventing moisture or impurities from reaching the TFT layer 12 and the OLED layer 20 formed on the support body 11, and can be formed, for example, by a silicon oxide (SiOx) film, a silicon nitride (SiNx) film, or a layered film of these, formed by CVD.

The barrier layer is provided over the whole surface of the plastic film, such that the surface of the plastic film is not exposed. In this way, even when a material with poor liquid chemical resistance, such as a polyimide, is used as the plastic film, elution of the plastic film by liquid chemicals and process contamination can be prevented.

When the organic EL display device 1 is the flexible display device, the lower face film is bonded to the plastic film (the resin layer) from which the glass substrate has been peeled, and thus, even when the resin layer is extremely thin, this is suitable for producing the organic EL display device 1 having sufficient strength. A plastic film formed from a flexible resin is used as the lower face film. Examples of the flexible resin include polyethylene terephthalate, polyethylene naphthalate, a cycloolefin polymer, a polyimide, a polycarbonate, polyethylene, and an aramid.

TFT Layer 12

The TFT layer 12 is a driving element layer provided with a TFT 18 as a driving element configured to drive an organic EL element 24 (to be described later) that is a light emitting element. The TFT layer 12 includes a semiconductor layer 13 formed in a plurality of island shapes, a gate insulating film 14 formed on the support body 11 covering the semiconductor layer 13, a first metal layer including a gate electrode G and formed on the gate insulating film 14, an inorganic insulating film 15 (first passivation film) covering the first metal layer, a second metal layer including a capacity electrode C and formed on the inorganic insulating film 15, an inorganic insulating film 16 (second passivation film) formed on the inorganic insulating film 15 covering the second metal layer, a third metal layer including a source electrode S, a drain electrode D, and a wiring line W and formed on the inorganic insulating film 16, an organic insulating film 17 including a flattening film, and the terminal portion 12T on which the plurality of terminals TM (terminal electrodes) for connecting to the outside are provided. Note that, as a third passivation film, an inorganic insulating film (not illustrated) may be provided on the third metal layer.

The semiconductor layer 13, the gate electrode G, the inorganic insulating films 15 and 16, the source electrode S, and the drain electrode D configure the TFT 18.

The source electrode S and the drain electrode D are connected to the semiconductor layer 13 with a contact hole provided in the gate insulating film 14 and the inorganic insulating films 15 and 16 interposed therebetween. The source electrode S is connected to a power source line (not illustrated), for example. The drain electrode D is connected to a first electrode 21 with a contact hole penetrating the organic insulating film 17 interposed therebetween. The wiring line W is connected to the capacity electrode C with a contact hole provided in the inorganic insulating film 16 interposed therebetween.

Furthermore, a gate wiring line (not illustrated) formed by the first metal layer is connected to the gate electrode G, and a source wiring line (not illustrated) formed by the third metal layer is connected to the source electrode S. The gate wiring line and the source wiring line are intersected orthogonal to each other in a plan view.

Regions surrounded in a lattice shape by the gate wiring line and the source wiring line are sub pixels 3, and a single pixel 4 is formed by a set of the sub pixels 3 of each of colors. In examples illustrated in FIGS. 1 and 2, a red sub pixel 3R, a green sub pixel 3G, and a blue sub pixel 3B are provided as the sub pixels 3, and the single pixel 4 is formed by the red sub pixel 3R, the green sub pixel 3G, and the blue sub pixel 3B. The TFT 18 is provided for each of the sub pixels 3.

Note that, in FIG. 1, an example is illustrated of a case in which the TFT 18 has a top gate configuration with the semiconductor layer 13 as a channel, but the TFT 18 may have a bottom gate configuration.

As illustrated in FIGS. 1 and 2, the organic EL display device 1 includes the display region 5 in which the sub pixels 3 are arranged in a matrix shape and on which an image is displayed, and the frame region 6, which is a peripheral region surrounding the periphery of the display region 5 and on which the sub pixels 3 are not arranged.

As illustrated in FIG. 1, the terminals TM are provided in a part of the frame region 6. The terminals TM are electrically connected to the gate wiring line, for example, with a lead-out wiring line (not illustrated) interposed therebetween. The source wiring line is connected to the terminals TM (not illustrated) with the lead-out wiring line (not illustrated) interposed therebetween.

The organic insulating film 17 includes a first organic insulating film pattern portion 17A formed extending from the display region 5 to part of the frame region 6, and, on the frame region 6, a second organic insulating film pattern portion 17B formed in a frame shape separated from the first organic insulating film pattern portion 17A and surrounding the first organic insulating film pattern portion 17A, and a terminal portion organic insulating film pattern portion 17T covering edge portions of the terminals TM.

Portions of the terminals TM that are not covered by the terminal portion organic insulating film pattern portion 17T are electrically connected to a flexible film cable, a flexible printed circuit (FPC) substrate, an external circuit such as an integrated circuit (IC), with an anisotropic conductive film (ACF) or the like interposed therebetween.

The first organic insulating film pattern portion 17A and the second organic insulating film pattern portion 17B function as flattening films to level the surface of the TFT layer 12.

The first organic insulating film pattern portion 17A covers the inorganic insulating film 16 and the third metal layer formed on the inorganic insulating film 16. In this way, the first organic insulating film pattern portion 17A levels out steps on the TFT 18 and the third metal layer in the display region 5.

The second organic insulating film pattern portion 17B is provided on the same plane as the first organic insulating film pattern portion 17A and at the same height as the first organic insulating film pattern portion 17A, such that the material of an organic layer 32 (to be described later) flows evenly onto the second organic insulating film pattern portion 17B.

Note that the TFT 18 and the organic EL element 24 are provided on the first organic insulating film pattern portion 17A, but the TFT 18 and the organic EL element 24 are not provided on the second organic insulating film pattern portion 17B.

OLED Layer 20

The OLED layer 20 includes the first electrode 21 (a bottom electrode), banks BK (walls, embankments), an organic EL layer 22 formed on the first electrode 21 and formed from an organic layer including at least a light emitting layer, and a second electrode 23 (a top electrode) formed on the organic EL layer 22.

The first electrode 21, the organic EL layer 22, and the second electrode 23 configure the organic EL element 24 (the OLED element). Note that, in the present embodiment, the layers between the first electrode 21 and the second electrode 23 are collectively referred to as the organic EL layer 22.

Furthermore, an optical adjustment layer (not illustrated) that performs optical adjustment, and a protection layer that protects the second electrode 23 and inhibits oxygen or moisture from infiltrating the organic EL element 24 from outside may be formed on the second electrode 23. In the present embodiment, the organic EL layer 22 formed on each of the sub pixels 3, the pair of electrode layers (the first electrode 21 and the second electrode 23) that sandwich the organic EL layer 22, and the optical adjustment layer and the protection layer (not illustrated) that are formed as necessary, are referred to together as the organic EL element 24.

The first electrode 21 is formed on the first organic insulating film pattern portion 17A in the display region 5. The first electrode 21 injects (supplies) holes into the organic EL layer 22 and the second electrode 23 injects electrons into the organic EL layer 22. The holes and the electrons injected into the organic EL layer 22 are recombined in the organic EL layer 22, and thus form excitons. The formed excitons emit light as they become deactivated from an excited state to a ground state, and the emitted light is emitted to the outside from the organic EL element 24.

The first electrode 21 is electrically connected to the TFT 18 with a contact hole formed in the organic insulating film 17 interposed therebetween.

The first electrode 21 is a pattern electrode formed in an island-shaped pattern for each of the sub pixels 3. Meanwhile, the second electrode 23, for example, is a solid-like common electrode provided in common to each of the sub pixels 3. However, the present embodiment is not limited to this configuration, and the second electrode 23 may be a pattern electrode formed in an island-shaped pattern for each of the sub pixels 3, and a configuration may be obtained in which each of the second electrodes 23 patterned in the island shapes are mutually connected using an auxiliary wiring line (not illustrated) or the like.

Furthermore, as illustrated in FIG. 3, the second electrode connecting portion 7, which connects the second electrode 23 to the wiring line formed on the TFT layer 12, is provided outside of the display region 5 (in the frame region 6).

The above-described wiring line connected to the second electrode 23 may be the gate wiring line or the capacity wiring line, may be the source wiring line, or may be other wiring line formed in the same layer as any of this wiring line (namely, formed in any of the first metal layer to the third metal layer).

In FIG. 3, an example is illustrated in which the above-described wiring line connected to the second electrode 23 is the source wiring line, for example. Thus, as illustrated in FIG. 3, the second electrode connecting portion 7 is formed, for example, surrounding the display region 5, apart from part of a region between the terminal portion 12T and the display region 5. In the region between the terminal portion 12T and the display region 5, the lead-out wiring line for the wiring line, such as the source wiring line, is formed in the part of the region in which the second electrode connecting portion 7 is not formed.

The banks BK include a bank BK1 disposed inside the display region 5, and banks BK2 to BK4 disposed in the frame region 6.

A peripheral portion of the first electrode 21 is covered by the bank BK1. The bank BK1 functions as an edge cover that inhibits, at the peripheral portion of the first electrode 21, a short circuit with the second electrode 23 due to electrode concentration or thinning of the organic EL layer 22, and also functions as a sub pixel isolation layer that isolates the sub pixels 3 from each other such that electric current does not leak to the adjacent sub pixel 3.

At the time of forming the organic layer 32 of the sealing film 30, which will be described later, the banks BK2 to BK4 cause a flow rate of an organic insulating material (ink), which is the material of the organic layer 32, to decrease in stages, and thus regulate the wet-spreading of the organic insulating material. Note that the banks BK2 to BK4 are described later along with the bank BK1.

As illustrated in FIGS. 1 and 2, in the bank BK1, an opening BK1A is provided for each of the sub pixels 3. Exposed parts of the first electrode 21 exposed by the opening BK1A form a light emitting region of each of the sub pixels 3.

When, for the organic EL layer 22 of the organic EL element 24, coating is performed by color such that a different color light is emitted for each of the sub pixels 3, as illustrated in FIG. 1, the organic EL layer 22 is formed for each of the regions (the sub pixels 3) surrounded by the bank BK1. Thus, the organic EL display device 1 illustrated in FIG. 1 emits red color light from the red sub pixel 3, emits green color light from the green sub pixel 3, and emits blue color light from the blue sub pixel 3. In this way, when the organic EL display device 1 is provided with the organic EL element 24 formed using the RGB separate coating method, full color image display can be performed using the red color light, the green color light, and the blue color light, without using a color filter.

For example, the organic EL layer 22 is configured by layering a hole injecting layer, a hole transport layer, a light emitting layer, an electron transport layer, and an electron injecting layer, in this order from the first electrode 21 side. A single one of the layers may have a plurality of functions. For example, in place of the hole injecting layer and the hole transport layer, a hole injection-cum-transport layer may be provided that has the functions of both the layers. Furthermore, in place of the electron injecting layer and the electron transport layer, an electron injection-cum-transport layer may be provided that has the functions of both the layers. In addition, a carrier blocking layer may be provided between each of the layers as appropriate.

Note that the above-described layering order is for a case in which the first electrode 21 is the positive electrode and the second electrode 23 is the negative electrode, and when the first electrode 21 is the negative electrode and the second electrode 23 is the positive electrode, the order of each of the layers configuring the organic EL layer 22 is inverted.

When the organic EL display device 1 is the bottom-emitting type configured to emit the light from a reverse face side of the support body 11, it is preferable that the second electrode 23 be formed by a reflective electrode, and the first electrode 21 be formed by a transparent electrode, such as an indium tin oxide (ITO), or by a semi-transparent light-transmissive electrode formed from a thin film of a metal such as gold (Au). At this time, to inject electrons into the light emitting layer, a metal with a small work function, such as lithium (Li) or aluminum (Al), or an alloy containing such a metal, such as a magnesium alloy (MgAg or the like), an aluminum alloy (AlLi, AlCa, AlMg or the like) is used as the second electrode 23.

Meanwhile, when the organic EL display device 1 is the top-emitting type configured to emit the light from the sealing film 30 side, it is preferable that the first electrode 21 be formed by a reflective electrode material, and the second electrode 23 be formed by a transparent or semi-transparent light-transmissive electrode material.

The first electrode 21 and the second electrode 23 may each have a single layer structure or may each have a layered structure. For example, when the organic EL element 24 is a top-emitting organic EL element, the first electrode 21 may have a layered structure configured by a reflective electrode and a transparent electrode.

Sealing Film 30

The sealing film 30 includes a first inorganic layer 31 (a lower layer inorganic sealing layer), the organic layer 32 (a first organic sealing layer), and a second inorganic layer 33 (an upper layer inorganic sealing layer), layered in this order from the TFT substrate 10 side.

The first inorganic layer 31 and the second inorganic layer 33 have a moisture-proof function to inhibit the infiltration of moisture, and function as barrier layers to inhibit deterioration of the organic EL element 24 caused by moisture or oxygen.

The organic layer 32 is used as a buffer layer (a stress relief layer), which relieves stress in the first inorganic layer 31 and the second inorganic layer 33 in which film stress is large, performs leveling and filling of pinholes by burying step portions and foreign material on the surface of the OLED layer 20 in the display region 5, and further, prevents the occurrence of cracks in the second inorganic layer 33 when the second inorganic layer 33 is layered, by leveling a foundation of the second inorganic layer 33.

The first inorganic layer 31 and the second inorganic layer 33 are each formed by CVD, for example, and each can be configured by a silicon oxide film, a silicon nitride film, or a silicon oxynitride film, or by a layered film of these films.

The organic layer 32 is thicker than the first inorganic layer 31 and the second inorganic layer 33, and is a light-transmissive organic insulating film. The organic layer 32 is formed, for example, by applying the liquid organic material on the first inorganic layer 31 on the display region 5 using an ink-jet method and the like, and curing the liquid organic material. A photosensitive resin, such as an acrylic resin, an epoxy resin, or a silicon resin can be used as the organic material. As the liquid organic material, the organic layer 32 can be formed, for example, by performing ink-jet application of an ink including this type of photosensitive resin onto the first inorganic layer 31, and then performing ultraviolet (UV) curing.

The first inorganic layer 31 is formed on the support body 11 over the whole surface of the display region 5 and the frame region 6, apart from the terminals TM, covering, in a plan view, the second electrode 23, the organic insulating film 17 apart from a part of the terminal portion 12T (more specifically, the first organic insulating film pattern portion 17A, the second organic insulating film pattern portion 17B, and an edge portion of the terminal portion organic insulating film pattern portion 17T closer to the second organic insulating film pattern portion 17B), the inorganic insulating film 15, and the banks BK that are not covered by the second electrode 23 (a part of the bank BK2, and the banks BK3 and BK4).

In addition to covering the first organic insulating film pattern portion 17A and the second organic insulating film pattern portion 17B, the organic EL element 24, and the banks BK1 to BK3, the organic layer 32 preferably covers an edge portion of the bank BK4 closer to the bank BK3 and a part of an upper portion of the bank BK4, with the first inorganic layer 31 interposed therebetween. The organic layer 32 is provided in the region surrounded by the bank BK4.

The second inorganic layer 33 is formed superimposing on the first inorganic layer 31. When the organic layer 32 is exposed, moisture infiltrates from the exposed surface of the organic layer 32. Thus, the first inorganic layer 31 and the second inorganic layer 33 are formed to sandwich the organic layer 32, such that the organic layer 32 is not exposed to the outside.

The second inorganic layer 33 covers the organic insulating film 17 apart from the part of the terminal portion 12T described above (more specifically, the first organic insulating film pattern portion 17A, the second organic insulating film pattern portion 17B, and the edge portion of the terminal portion organic insulating film pattern portion 17T closer to the second organic insulating film pattern portion 17B), the organic EL element 24, the inorganic insulating film 15, and the banks BK1 to BK4 with at least the first inorganic layer 31 of the first inorganic layer 31 and the organic layer 32 interposed therebetween.

Banks BK1 to BK4

Of the banks BK1 to BK4, the bank BK1 is formed on the organic insulating film 17 in the display region 5. Meanwhile, the banks BK2 and BK3 are formed on the organic insulating film 17 in the frame region 6. The bank BK4 is formed on the inorganic insulating film 15 in the frame region 6.

More specifically, as described above, the bank BK1 is provided in a lattice shape in a plan view, for example, on the first organic insulating film pattern portion 17A inside the display region 5, covering each of the edges of the first electrode 21 disposed in the matrix shape.

The bank BK1 has a protrusion t for each of the plurality of sub pixels 3. The bank BK1 includes a low bank portion BK1a (a one step bank portion) having a first height h11 (hereinafter referred to simply as "h11" or the "height h11"), and a high bank portion BK1b (a two step bank portion) having a second height h12 (hereinafter referred to simply as "h12" or the "height h12") that is higher than h11.

The protrusion t (in other words, the high bank portion BK1b including the protrusion t) is used, together with the banks BK2 and BK3, as a spacer (support body) that supports a mask for vapor deposition that is used for vapor deposition for each color of layers, such as the organic EL layer 22, formed inside the opening BK1A of the bank BK1. The mask for vapor deposition is supported in a state of being separated from a film-deposited substrate such that the mask for vapor deposition does not come into contact with a surface of the film-deposited substrate.

The height of the protrusion t is not particularly limited to a specific value, and is set such that the height h12 of the high bank portion BK1b is greater than h11. As an example, the height h11 of the low bank portion BK1a is formed to be from 1 μm to 2.5 μm, and the height h12 of the high bank portion Bk1b is formed to be from 1.5 μm to 3.5 μm (h11 is less than h12).

Note that the height h11 of the low bank portion BK1a may be the same height as a height h1 of the bank BK4 to be described later. However, the height h11 of the low bank portion BK1a and the height h1 of the bank BK4 need not necessarily be the same.

The bank BK2 is formed in a frame shape on the first organic insulating film pattern portion 17A of the frame region 6, surrounding the display region 5.

The bank BK2 is formed by a plurality of dot-shaped banks BK2a that are separated from each other, and each of the dot-shaped banks is arranged in a plurality of rows to form an intermittent frame shape. As illustrated in FIG. 2, for example, the bank BK2 has a configuration in which the dot-shaped banks BK2a of the adjacent rows are disposed regularly in a zig-zag shape with respect to each other in a plan view.

The bank BK3 is formed in a frame shape on the second organic insulating film pattern portion 17B while surrounding the bank BK2. The bank BK3 is formed by a plurality of dot-shaped banks BK3a that are separated from each other, and each of the dot-shaped banks is arranged in a plurality of rows to form an intermittent frame shape. As illustrated in FIG. 2, for example, the bank BK3 has a configuration in which the dot-shaped banks BK3a of the adjacent rows are disposed regularly in a zig-zag shape with respect to each other in a plan view.

The banks BK2 and BK3 function as a spacer (support body) that supports a mask for vapor deposition used for the vapor deposition of the layers formed on the display region 5. The mask for vapor deposition is supported in a state of being separated from the film-deposited substrate, such that the mask for vapor deposition does not come into contact with the surface of the film-deposited substrate on which the film is formed.

For example, as described above, along with the high bank portion BK1b, the banks BK2 and BK3 support the mask for vapor deposition used for the vapor deposition for each color of the layers, such as the organic EL layer 22, formed inside the opening BK1A of the bank BK1, such that the mask for vapor deposition is separated from the film-deposited substrate. Furthermore, the banks BK2 and BK3 function as a spacer that supports a mask for vapor deposition used for the vapor deposition of the second electrode 23 as illustrated in an embodiment to be described later. The mask for vapor deposition is supported in a state of being separated from the surface of the film-deposited substrate and from the bank BK1, such that the mask for vapor deposition does not come into contact with the surface of the film-deposited substrate and the bank BK1. Note that, when the second electrode 23 has the island-shaped patterns mutually connected by an auxiliary wiring line and the like, the mask for vapor deposition used in the vapor deposition of the second electrode 23 and the like may come into contact with the bank BK1 (more specifically, the upper face of the high bank portion BK1b).

Thus, a height h21 of the bank BK2 and a height h31 of the bank BK3 may be formed at the same height as the height h12 of the high bank portion BK1b, for example. As an example, the height h21 of the bank Bk2 is formed to be from 1.5 μm to 3.5 μm, and the height h31 of the bank BK3 is formed to be from 1.5 μm to 3.5 μm. However, the height h21 of the bank BK2 and the height h31 of the bank BK3 need not necessarily be the same, and, as in an embodiment to be described later, they may be mutually different heights.

In other words, a total height of the first organic insulating film pattern portion 17A and the bank BK2 formed thereon, and a total height of the second organic insulating film pattern portion 17B and the bank BK3 formed thereon may be the same height as a total height of the first organic insulating film pattern portion 17A and the high bank portion BK1b of the bank BK1 formed thereon.

Furthermore, when the total heights, namely, the heights from the surface of a foundation layer (an uppermost layer passivation film) on which the organic insulating film 17 and the bank BK4 are provided to the respective faces of the high bank portion BK1b and the banks BK2 and BK3, which are contact faces with the mask for vapor deposition, are each denoted as a height h3, the organic insulating film 17 and the banks BK1 to BK3 may be formed such that h3 is higher than the height h1 of the bank BK4.

Furthermore, at the time of forming the organic layer 32 of the sealing film 30, the banks BK2 and BK3 cause the flow rate of the organic insulating material (ink), which is the material of the organic layer 32, to decrease in stages, and thus regulate the wet-spreading of the organic insulating material.

In particular, by using the dot-shaped banks BK2a and BK3a as the banks BK2 and BK3, after the liquid organic material that is used for the organic layer 32 is applied using the ink-jet method or the like, the dot-shaped banks BK2a and BK3a align the edges of the wetly spreading liquid organic material, inhibit the flow of the wetly spreading liquid organic material, and align the edge portions of the liquid organic material to be in a substantially straight line shape.

Furthermore, the liquid organic material passes the banks BK2 and BK3 and spreads wetly, and as a result, the banks BK2 and BK3 function as resistance. This can decrease the speed of the wet spreading of the liquid organic material passing the banks BK2 and BK3. According to the present embodiment, in this way, the banks BK2 and BK3 provided closer to the display region 5 than the bank BK4 can inhibit the flow of the liquid organic material.

Furthermore, the second organic insulating film pattern portion 17B is separated from the first organic insulating film pattern portion 17A, and thus the second organic insulating film pattern portion 17B on which the bank BK3 is provided is used as a first dam portion DM1 configured to inhibit the infiltration of moisture into the TFTs 18 and the organic EL elements 24 inside the first organic insulating film pattern portion 17A. In this way, the separated organic insulating film 17 can block a path of permeation of the moisture, allowing the reliability of the organic EL display device 1 to be improved.

Furthermore, although not illustrated, in the present embodiment, the second electrode 23 is formed covering the bank BK2 formed along a side of the first organic insulating film pattern portion 17A on which the second electrode connecting portion 7 is provided.

Thus, since the bank BK2 is formed by the plurality of dot-shaped banks BK2a, the second electrode 23 is formed covering the steps of the dot-shaped banks BK2a, and at the same time, is formed on planar portions of gaps between the dot-shaped banks BK2as. In this way, the bank BK2 formed from the plurality of dot-shaped banks BK2a allows the second electrode 23 and the second electrode connecting portion 7 to be reliably conductive.

Note that, in FIGS. 1 and 2, an example is illustrated of a case in which the bank BK2 is a fourfold frame-shaped bank formed from four rows of the dot-shaped banks BK2a that are disposed in an intermittent frame-shape, and the bank BK3 is a sixfold frame-shaped bank formed from six rows of the dot-shaped banks BK3a that are disposed in an intermittent frame-shape. However, it is sufficient that the dot-shaped banks BK2a and BK3a be formed in a double-frame shape with a greater number than the double-frame shape, respectively.

Furthermore, in FIG. 2, an example is illustrated of a case in which the dot-shaped banks BK2a and BK3a have a triangular shape in a plan view. However, the present embodiment is not limited to this configuration, and a planar shape of the dot-shaped banks BK2a and BK3a may be a circular hemispherical shape or a circular cylindrical shape, or the planar shape may be an oval-shaped semi-elliptical spherical shape or an elliptical cylindrical shape. Furthermore, the planar shape of the dot-shaped banks BK2a and BK3a may be a rectangular quadrilateral cylindrical shape.

Furthermore, each of the banks BK2 and BK3 may be formed in the continuous line shape. In this case, both of the banks BK2 and BK3 need not necessarily be formed in the double-frame shape.

Since the bank BK4 holds back the liquid organic material used in the organic layer 32 (in other words, holds back the organic layer 32), the bank BK4 is an organic layer stopper (a first organic layer stopper, a main organic layer stopper) that defines the edges of the organic layer 32, and the bank BK4 overlaps with the edges of the organic layer 32. The bank BK4 is formed, not in a dot shape, but in the frame shape that is formed by a continuous line, surrounding, on the outside of the second organic insulating film pattern portion 17B, the first organic insulating film pattern portion 17A in which the display region 5 is provided and the second organic insulating film pattern portion 17B.

Furthermore, since the first organic insulating film pattern portion 17A and the second organic insulating film pattern portion 17B are isolated from each other, the bank BK4 is used as a second dam portion DM2 configured to inhibit the infiltration of moisture into the TFTs 18 and the organic EL elements 24 inside the first organic insulating film pattern portion 17A.

In the organic EL display device 1 illustrated in FIGS. 1 and 2, recessed portions BK4b (groove portions) are formed in the upper face (top face) of the bank BK4 surrounding the first organic insulating film pattern portion 17A and second organic insulating film pattern portion 17B.

In other words, recessed portions and protrusions including a plurality of protrusions BK4a having planar portions (flat surfaces) on the upper face (top face) thereof, are formed on the upper face (top face) of the bank BK4. The protrusions BK4a and the recessed portions BK4b on the upper face of the bank BK4 are each formed in the frame shape, surrounding the first organic insulating film pattern portion 17A and second organic insulating film pattern portion 17B.

Figure 4:
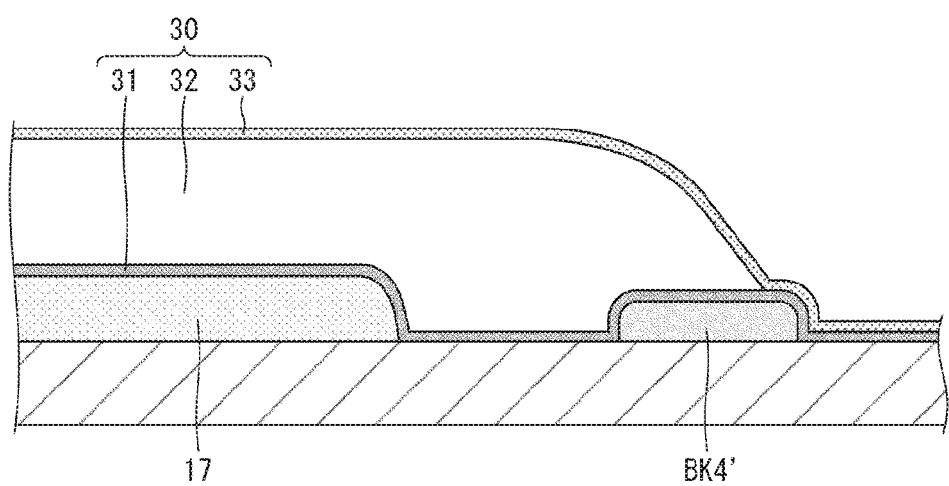
FIG. 4 is a cross-sectional view illustrating an example of a schematic configuration of main portions of the organic EL display device when, in place of an organic layer stopper illustrated in FIG. 1, a wide-width organic layer stopper including an upper face on which recessed portions and protrusions are not formed, is formed.
Figure 5:
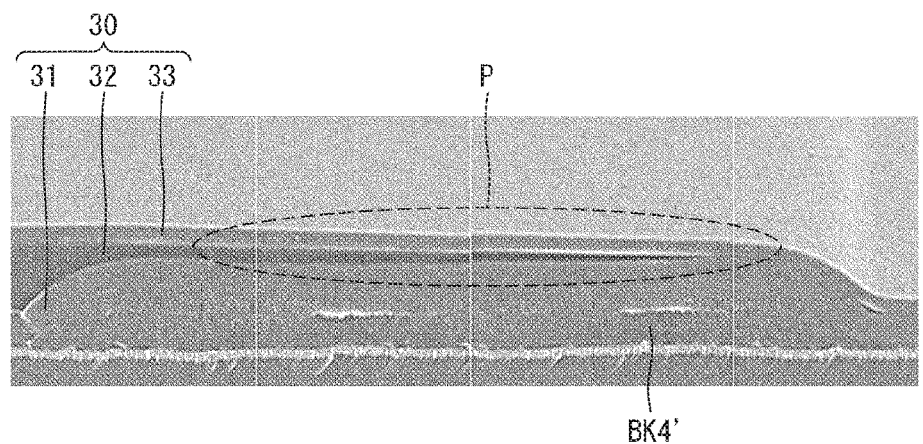
FIG. 5 is a diagram illustrating a scanning electron microscope (SEM) photograph of a sealing film formed on the organic layer stopper illustrated in FIG. 4.
Figure 6:
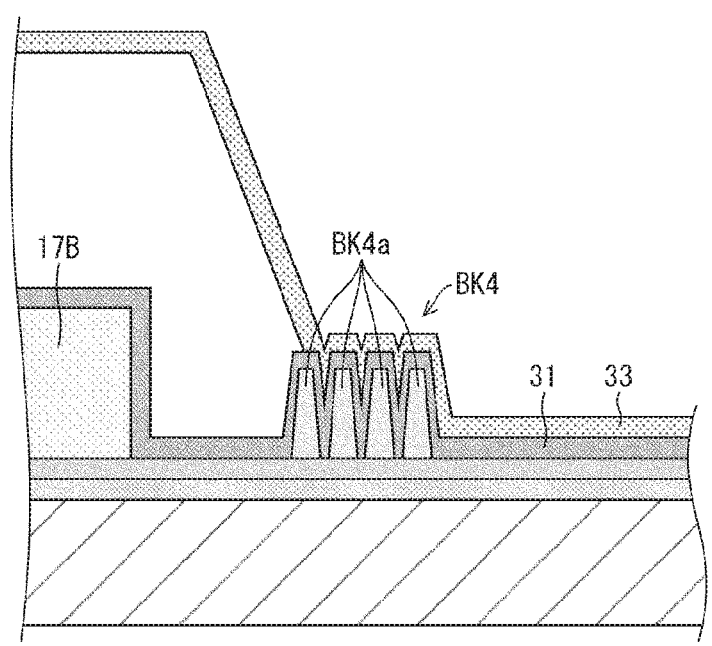
FIG. 6 is a cross-sectional view illustrating an example of a schematic configuration of main portions of the organic EL display device when protrusions of the organic layer stopper illustrated in FIG. 1 are separated from each other.

FIG. 4 is a cross-sectional view illustrating an example of a schematic configuration of main portions of the organic EL display device 1 when, in place of the bank BK4, a wide frame-shaped bank BK4' including the upper surface on which recessed portions and protrusions are not formed is formed. FIG. 5 is a diagram illustrating a Scanning Electron Microscope (SEM) photograph of the sealing film 30 formed on the bank BK4' illustrated in FIG. 4. FIG. 6 is a cross-sectional view illustrating an example of a schematic configuration of main portions of the organic EL display device 1 when protrusions BK4a of the bank BK4 illustrated in FIG. 1 are separated from each other.

As illustrated in FIG. 5, the wet-spreading of the liquid organic material used in the organic layer 32 easily accumulates on the planar portion (a region P illustrated and enclosed by a dotted line in FIG. 5) on the upper face of the bank BK4' and is held back by and temporarily held on the planar portion.

Thus, to hold back the liquid organic material, it is effective to increase an area of the planar portion of the upper face of the bank BK4 that functions as the organic layer stopper, and to hold back the organic material that flows over and flows down the planar portions, it is effective to provide the recessed portions and the protrusions in the upper face of the bank BK4 (specifically, in the portion corresponding to the region P in the bank BK4'), and increase the number of planar portions of the upper faces of the protrusions BK4a.

Furthermore, as illustrated in FIG. 6, when the adjacent protrusions BK4a are separated from each other and caused to be mutually independent, assuming that the area of the formation region of the bank BK4 is the same, in comparison to when the protrusions BK4a are not separated from each other (namely, when the recessed portions BK4b do not reach the base of the bank BK4), the area of the planar portion of the upper face becomes smaller. In other words, when the adjacent protrusions BK4a are separated from each other and caused to be mutually independent, to secure the same area of the planar portions as when the protrusions BK4a are not separated from each other, it is necessary to increase the formation region of the bank BK4. Furthermore, when the recessed portions BK4b are provided reaching the base of the bank BK4, to cause the first inorganic layer 31 to follow the bottom faces of the recessed portions BK4b, it is necessary to secure a width of the recessed portions BK4b that accords with the depth of the recessed portions BK4b. Due to these reasons, when the adjacent protrusions BK4a are separated from each other and caused to be mutually independent, in comparison to when the protrusions BK4a are not separated from each other, the area of the frame region 6 increases.

Thus, the plurality of recessed portions and protrusions including the plurality of protrusions BK4a having the planar portions are provided on the upper face of the bank BK4. This allows the number of locations capable of holding back the liquid organic material to be increased and the liquid organic material to be held back more reliably, while a total area of an installation region of the bank functioning as the organic layer stopper can also be reduced and frame narrowing can be achieved.

Furthermore, as described above, in general, at least one frame-shaped bank is formed outside of the first organic layer stopper (main organic layer stopper) as insurance. The first organic layer stopper is located furthest to the inside among the organic layer stoppers provided outside of the flattening film while surrounding the display region. This is because in a case that the first organic layer stopper cannot hold back the liquid organic material, the at least one frame-shaped bank is caused to function as a back-up organic layer stopper capable of holding back the liquid organic material that has flowed over from the first organic layer stopper. Therefore, in general, on the outside of the flattening film covering the TFTs, a plurality of frame-shaped banks are formed surrounding the display region as multiple banks, as the organic layer stopper.

However, according to the present embodiment, as described above, the recessed portions and the protrusions provided in the upper face of the bank BK4, which is the first organic layer stopper, can effectively hold back the liquid organic material. As a result, as illustrated in FIGS. 1 and 2, the organic EL display device 1 according to the present embodiment can hold back the liquid organic material even without a back-up organic layer stopper being provided.

When the protrusions BK4a have not the planar portions on the upper faces thereof, it becomes difficult to hold back the liquid organic material. In the present embodiment, although it is sufficient that the protrusions BK4a have the planar portions on the upper faces thereof, when the width in a short direction (namely, a direction orthogonal to the extension direction of the bank BK4) of the upper faces of the protrusions BK4a (more specifically, the width of the planar portions of the upper faces of the protrusions BK4a) is denoted by d1, d1 is preferably at least 15 µm.

Note that the wider d1 is, the greater the effect of holding back the liquid organic material, and an upper limit thereof is not particularly limited to a specific value. However, the wider d1 is, the wider the width of the frame region 6 becomes. Therefore, although dependent on the number of protrusions BK4a, from the point of view of frame narrowing, d1 is preferably 20 µm or less, for example.

Furthermore, when a width (a minimum distance) between the planes of the adjacent protrusions BK4a is denoted by d2, although d2 is not particularly limited to a specific value, from the point of view of frame narrowing, d2 is preferably 5 µm or less (namely, 0<d2≤5 µm).

According to the organic EL display device 1 illustrated in FIGS. 1 and 2, by making the d1 within a range from 15 µm to 20 µm, for example, and making the d2 equal to or less than 5 µm, the width of the frame region 6 outside a formation region of the terminal portion 12T, for example, can be kept to 100 µm or less.

Note that, in the present embodiment, as long as the protrusions BK4a are provided in the plurality, the number of protrusions BK4a is not particularly limited to a specific value. In other words, it is sufficient that at least one of the recessed portions BK4b between the adjacent protrusions BK4a is provided, and the number of recessed portions BK4b is not particularly limited to specific value. However, although the effect of holding back the liquid organic material is increased as the number of protrusions BK4a increases, the area of the frame region 6 becomes large. Thus, the number of protrusions BK4a is more preferably within a range of 3 or greater and 5 or less.

Furthermore, as described above, from the point of view of holding back the liquid organic material, a total of the widths d1 of the bank BK4 is preferably 35 µm or greater, and from the point of view of the frame narrowing, is preferably 70 µm or less.

Furthermore, as described above, when the height of the bank BK4 is denoted by h1, to minimize a distance from the bank BK4 to where a film thickness of the organic layer 32 becomes level, h1 is preferably 3 µm or greater, and even more preferably 3.5 µm or greater.

Note that, as described above, h1 may be lower than h3 (namely, the height from the surface of the foundation layer on which the organic insulating film 17 and the bank BK4 are provided, to the upper faces of each of the high bank portion BK1b and the banks BK2 and BK3, which are the contact faces with the mask for vapor deposition).

Furthermore, when the depth of the recessed portions BK4b (in other words, the height of the protrusions BK4a) is denoted by h2, to obtain the sufficient holding back effect of the liquid organic material, h2 is preferably 0.2 µm or greater, and from the point of view of frame narrowing and from the point of view of the conformation of the first organic layer 31 to the recessed portions BK4b, h2 is preferably 0.5 µm or less, for example.

Note that, to improve coverage of a formation surface formed for each of the banks BK, a cross-section thereof is preferably a forwardly tapered shape.

In the present embodiment, as illustrated in FIG. 2, the display region 5 is formed as a quadrilateral shape. Thus, the first organic insulating film pattern portion 17A is preferably formed such that a straight line distance from each of the edge portions of the display region 5 to each of inside side faces of the first organic insulating film pattern portion 17A facing each of the edge portions is constant. In this way, the liquid organic material can be uniformly applied and spread.

As a result, the first organic insulating film pattern portion 17A is preferably formed, in correspondence to the quadrilateral-shaped display region 5, in a quadrilateral shape having a substantially similar shape to that of the outer shape of the display region 5, and is preferably formed such that corner portions thereof facing corner portions 5c of the display region 5 are curved.

Similarly, the second organic insulating film pattern portion 17B is preferably formed such that a straight line distance from each of outside side faces of the first organic insulating film pattern portion 17A to each of inside side faces of the second organic insulating film pattern portion 17B facing each of the outside side faces is constant. Similarly, the bank BK4 is preferably formed such that a straight line distance from each of outside side faces of the second organic insulating film pattern portion 17B to each of inside side faces of the bank BK4 facing each of the outside side faces is constant.

In other words, the second organic insulating film pattern portion 17B is preferably formed such that a straight line distance from each of the edge portions of the display region 5 to each of the inside side faces of the second organic insulating film pattern portion 17B facing each of the edge portions is constant, and the bank BK4 is preferably formed such that a straight line distance from each of the edge portions of the display region 5 to each of the inside side faces of the bank BK4 facing each of the edge portions is constant.

Thus, the outer shapes (the outer edge shape of the frame) of the second organic insulating film pattern portion 17B and the bank BK4 that surround the first organic insulating film pattern portion 17A are also preferably formed in a quadrilateral shape having a substantially similar shape to that of the outer shape of the display region 5, and corner portions BK4c facing the corner portions 5c of the display region 5 are preferably formed to be curved.

However, the present embodiment is not limited to this configuration, and the four corner portions of each of the first organic insulating film pattern portion 17A, the second organic insulating film pattern portion 17B, and the bank BK4 facing the corner portions 5c of the display region 5 may be curved lines as illustrated in FIG. 2, or may be right angles. In other words, the bank BK4 may have the frame shape having the curved corner portions BK4c (the corner portions BK4c have an arc-shaped frame shape, specifically, the frame shape having curvature at the corner portions BK4c), or may have a frame shape having a right-angled four sided shape in which the corner portions BK4c are straight angled corners.

Furthermore, as illustrated in FIG. 2, the display region 5 is not limited to having the quadrilateral shape, and can be formed in a polygonal shape or an elliptical shape other than the quadrilateral shape, or can be formed in any desired shape. Note that, in this case, the outer shapes (the outer edge shape of the frame) of the first organic insulating film pattern portion 17A, the second organic insulating film pattern portion 17B, and the bank BK4 are also preferably formed in a shape having a substantially similar shape to that of the outer shape of the display region 5.

As described above, in the present embodiment, the frame-shaped bank BK2, the frame-shaped bank BK3, and the frame-shaped bank BK4 are formed outside of the lattice-shaped bank BK1, and are provided in the above order from the inside to the outside with the lattice-shaped bank BK1 at the center.

The banks BK1 to BK4 are formed from an organic insulating material. The banks BK1 to BK4 are formed, for example, from a photosensitive resin, such as an acrylic resin, or a polyimide resin. The banks BK1 to BK4 can be formed in the same production process, for example.

Cover Body

As described above, a cover body (not illustrated) is provided on the sealing film 30. The cover body is a functional layer having at least one of a protection function, an optical compensation function, and a touch sensor function, and, when the organic EL display device 1 is the flexible display device, for example, the cover body may be a protection film that functions as a support body when the glass substrate is peeled off. Furthermore, when the organic EL display device 1 is the non-foldable, rigid display device, the cover body may be a counter substrate such as the glass substrate, and a filling layer formed from a filling material (not illustrated) may further be provided between the counter substrate and the organic EL substrate 2.

In addition, the cover body may be provided with a functional film, such as a polarizing film and a touch sensor film, or may be provided with a polarizing plate, a touch panel, and the like.

Production Method of Organic EL Display Device 1

Next, with reference to FIGS. 1 and 2, a production method of the organic EL display device 1 will be described below.

First, as illustrated in FIG. 1, using a known method (a known TFT production process), the semiconductor layer 13, the gate insulating film 14 formed on the support body 11 and covering the semiconductor layer 13, the first metal layer formed on the gate insulating film 14 and including the gate electrode G, the inorganic insulating film 15 covering the first metal layer, the second metal layer formed on the inorganic insulating film 15 and including the capacity electrode C, the inorganic insulating film 16 formed on the inorganic insulating film 15 and covering the second metal layer, the third metal layer formed on the inorganic insulating film 16 and including the source electrode S, the drain electrode D, and the wiring line W, and the terminal portion 12T having the terminals TM are formed on the support body 11.

Note that, when the organic EL display device 1 is the flexible display device, a resin film (plastic film) such as a polyimide layer and a moisture-proof layer that configure the support body 11 are formed on a carrier substrate, such as the glass substrate, and each of the above-described layers are formed thereon, using the known method.

Amorphous silicon, low-temperature polysilicon (LTPS), or an oxide semiconductor is used as the semiconductor layer 13, for example. Silicon oxide (SiOx) or silicon nitride (SiNx), or a layered film of silicon oxide and silicon nitride, is used as the gate insulating film 14, for example.

For the first metal layer including the gate electrode G, the second metal layer including the capacity electrode C, the third metal layer including the source electrode S, the drain electrode D, and the wiring line W, and the terminals TM, for example, a single layer of a metal such as aluminum (Al), tungsten (W) molybdenum (Mo), tantalum (Ta), chromium (Cr), titanium (Ti), or copper (Cu), or a layered film of these, is used.

Silicon oxide (SiOx) or silicon nitride (SiNx) is used as the inorganic insulating films 15 and 16, for example.

Next, a photosensitive resin, such as an acrylic resin or a polyimide resin, is applied onto the support body 11 on which these wiring lines and the like are formed, and patterning is performed by photolithography or the like, thus forming the organic insulating film 17 by the known method (the known TFT production process). At this time, in the present embodiment, as the organic insulating film 17, the organic insulating film 17 is formed that includes the first organic insulating film pattern portion 17A, the second organic insulating film pattern portion 17B, and the terminal portion organic insulating film pattern portion 17T. In this way, the TFT substrate 10 is formed.

Next, a known method (a known TFT production process), such as a sputtering method, is used to pattern form the first electrode 21 in the matrix shape. At this time, the first electrode 21 is electrically connected to the drain electrode D with a contact hole formed in the organic insulating film 17 interposed therebetween.

Next, an organic film (not illustrated) that is formed, for example, by a positive-working photosensitive resin such as an acrylic resin or a polyimide resin, is formed in order to cover the first electrode 21, the organic insulating film 17, and the inorganic insulating films 15 and 16.

Next, as illustrated in FIGS. 1 and 2, the banks BK1 to BK4 formed by the above-described organic film are pattern formed by photolithography or the like.

At this time, in the present embodiment, the recessed portions and the protrusions including the protrusions BK4a having the planar portions, and the recessed portions BK4b, are formed in the upper face of the bank BK4.

For the protrusions BK4a and the recessed portions BK4b in the bank BK4, a half tone mask is used as the mask in the photolithography, and in this way, the protrusions BK4a and the recessed portions BK4b can be formed at the same time as the banks BK1 to BK3. Thus, each of the banks BK1 to BK4 can be pattern formed using the same material in the same production process. However, the banks BK1 to BK4 may be formed in separate production processes using mutually different masks and materials.

After that, as illustrated in FIG. 1, the organic EL layer 22 is formed by vapor deposition for each color, corresponding to each of the sub pixels 3R, 3G, and 3B, such that light emitting layers of each color cover the region surrounded by the bank BK1 (namely, the opening BK1A). Note that in the film formation of the organic EL layer 22, a method other than the vapor deposition method may be used, such as a paint-on method, the ink-jet method, or a printing method.

To perform the full color display, as an example, the light emitting layers can be pattern formed by the vapor deposition for each color, that is, for each of the light emission colors, as described above. However, the present embodiment is not limited to this example, and, to perform the full color display, a configuration may be used in which the white color light emitting organic EL element 24 that uses a white color (W) light emitting layer configured to emit white light, is used in combination with a color filter (CF) layer (not illustrated), and the light emission color for each of the sub pixels 3 is selected. Furthermore, while using the light emitting layer whose light emission color is the color W, the full color image display may be realized by introducing a micro cavity structure for each of the sub pixels 3. Note that, when changing the light emission color of each of the sub pixels 3 using the method using the CF layer, the micro cavity structure, or the like, it is not necessary for the light emitting layers to be formed for each of the sub pixels 3.

Next, the second electrode 23 is pattern formed by vapor deposition using a vapor deposition mask, for example, over the whole surface of the display region 5 on the TFT substrate 10, so as to cover the organic EL layer 22 and the banks BK1 and BK2, to be electrically connected to the second electrode connecting portion 7, and so as to expose regions other than these regions.

In this way, the organic EL element 24 formed by the first electrode 21, the organic EL layer 22, and the second electrode 23 can be formed on the TFT substrate 10.

Next, the sealing film 30 is formed on the TFT substrate 10 on which the organic EL element 24 has been formed. Specifically, first, on the TFT substrate 10 on which the organic EL element 24 has been formed, the first inorganic layer 31 formed from the silicon nitride, the silicon oxide, or the like is formed by CVD or the like over the whole surface of the display region 5 and the frame region 6, excluding the terminals TM, so as to cover, in a plan view, the second electrode 23, the organic insulating film 17 excluding a part of the terminal portion 12T, the inorganic insulating film 15, and the banks BK that are not covered by the second electrode 23 (a part of the bank BK2, the bank BK3, and the bank BK4).

Next, the liquid organic material (the ink, for example) including the photosensitive resin is applied on the whole surface of the display region 5 using the ink-jet method, for example.

According to the present embodiment, since the recessed portions and the protrusions including the plurality of protrusions BK4a having the planar portions are provided on the upper face of the bank BK4, the liquid organic material is held back by the planar portions of the upper face of the protrusions BK4a. First, the liquid organic material is temporarily held by the planar portion on the upper face of the protrusion BK4a (for ease of explanation, hereinafter referred to as the first protrusion BK4a) located furthermost to the inside (namely, closer to the display region 5). The liquid organic material easily accumulates on the planar portions on the upper face of the bank BK4 and is preferably held back by the planar portion on the upper face of the first protrusion BK4a.

However, after being temporarily held by the planar portion of the first protrusion BK4a, the liquid organic material that cannot be held back by the first protrusion BK4a and that flows over the first protrusion BK4a flows into the recessed portion BK4b (hereinafter referred to as the first recessed portion BK4b) between the first protrusion BK4a and the adjacent protrusion BK4a (for ease of explanation, hereinafter referred to as the second protrusion BK4a). Then, the liquid organic material that overflows from the first recessed portion BK4b is held by the planar portion on the upper face of the second protrusion BK4a.

According to the present embodiment, as described above, the bank BK4 is provided with the recessed portions and the protrusions including the plurality of protrusions BK4a, and thus, the protrusions BK4a provided outside of the first protrusion BK4a function as back-up organic layer stoppers. Thus, according to the present embodiment, even in a case where a frame-shaped bank that functions as the back-up organic layer stopper is not further provided outside of the bank BK4, the liquid organic material can be held back by the bank BK4, and at the same time, in comparison to a case in which the back-up organic layer stopper is provided, frame narrowing can be realized.

In the present embodiment, in this way, the bank BK4 holds back the liquid organic material. The liquid organic material that has been held back by the bank BK4 is irradiated with UV light, and this causes the liquid organic material to cure, thus forming the organic layer 32.

After that, an inorganic insulating film formed from the silicon nitride or the silicon oxide is formed by CVD or the like on the organic layer 32 and the first inorganic layer 31, and thus, the second inorganic layer 33 is formed over the whole surface of the display region 5 and the frame region 6, excluding on the terminals TM. In this way, the sealing film 30 configured by the first inorganic layer 31, the organic layer 32, and the second inorganic layer 33 is formed.

After that, as the cover body, a cover film (a protection film) (not illustrated) or the like is bonded onto the sealing film 30.

Note that, when the organic EL display device 1 is the flexible display device, after that, an interface between the carrier substrate and the resin layer is irradiated with laser light from a reverse face side of the carrier substrate (namely, toward a face opposite the face on which the TFT layer 12 is formed), thus causing ablation. As a result, the carrier substrate is peeled off at the interface. At this time, the cover film functions as the support body when peeling the carrier substrate. After that, as a lower face film, a transparent plastic film, for example, is bonded to a face of the resin layer from which the carrier substrate is peeled.

Note that, in the above-described TFT production processes, when a mother substrate formed from a large glass substrate is used as the support body in place of the support body 11, or when the mother substrate including the large glass substrate as the carrier substrate is used, after the above-described production processes, the organic EL substrate 2 is cut into individual pieces by dividing (dicing) the mother substrate. Note that, for the dividing, a laser, a metal blade, or the like can be used.

After that, as necessary, a functional film, such as a polarizing film and a touch sensor film, or a polarizing plate, a touch panel or the like, is bonded to the organic EL substrate 2. In this way, the organic EL display device 1 according to the present embodiment is formed.

First Modified Example

Figure 7:
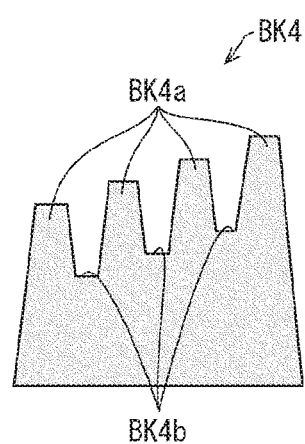
FIG. 7 is a cross-sectional view illustrating an example of a shape of an organic layer stopper according to a first modified example of the first embodiment of the disclosure.

FIG. 7 is a cross-sectional view illustrating an example of a shape of the bank BK4 according to a present modified example.

As illustrated in FIG. 7, the protrusions BK4a of the bank BK4 may be formed using a half tone mask as a mask, for example, such that the further to the outside the protrusion BK4a is, the higher the height of the bank BK4.

Second Modified Example

Furthermore, as described above, in the present embodiment, as the example of the display device according to the present embodiment, the organic EL display device 1 including the organic EL elements 24 (the OLED elements) as the light emitting elements is described as the example. However, the display device according to the present embodiment is not particularly limited as long as it is the flexible and bendable display device provided with optical elements. The optical element can include, for example, an electro-optical element in which luminance and transmittance are controlled by an electric current, or an electro-optical element in which luminance and transmittance are controlled by voltage.

The display panel (display device) provided with the electro-optical elements controlled by the electric current can include, for example, an Electro luminescence (EL) display provided with Organic Light Emitting Diode (OLED) elements, an EL display such as an inorganic EL display provided with inorganic light emitting diode elements (inorganic EL elements), or a QLED display provided with Quantum-dot Light Emitting Diode (QLED) elements. Furthermore, the electro-optical element controlled by voltage can be, for example, a liquid crystal display element or the like.

Second Embodiment

Figure 8:
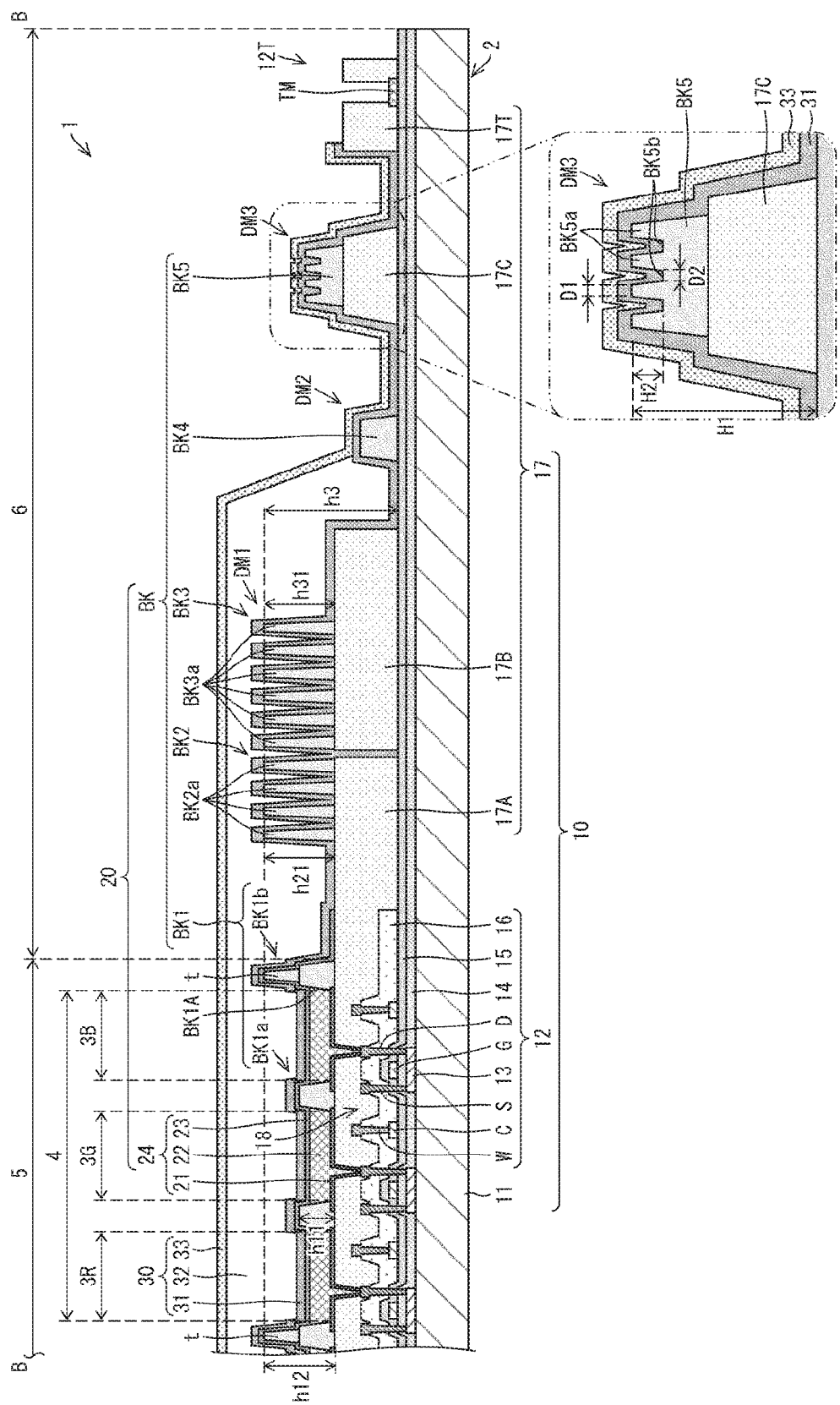
FIG. 8 is a cross-sectional view illustrating an example of a schematic configuration of main portions of the organic EL display device according to a second embodiment of the disclosure.
Figure 9:
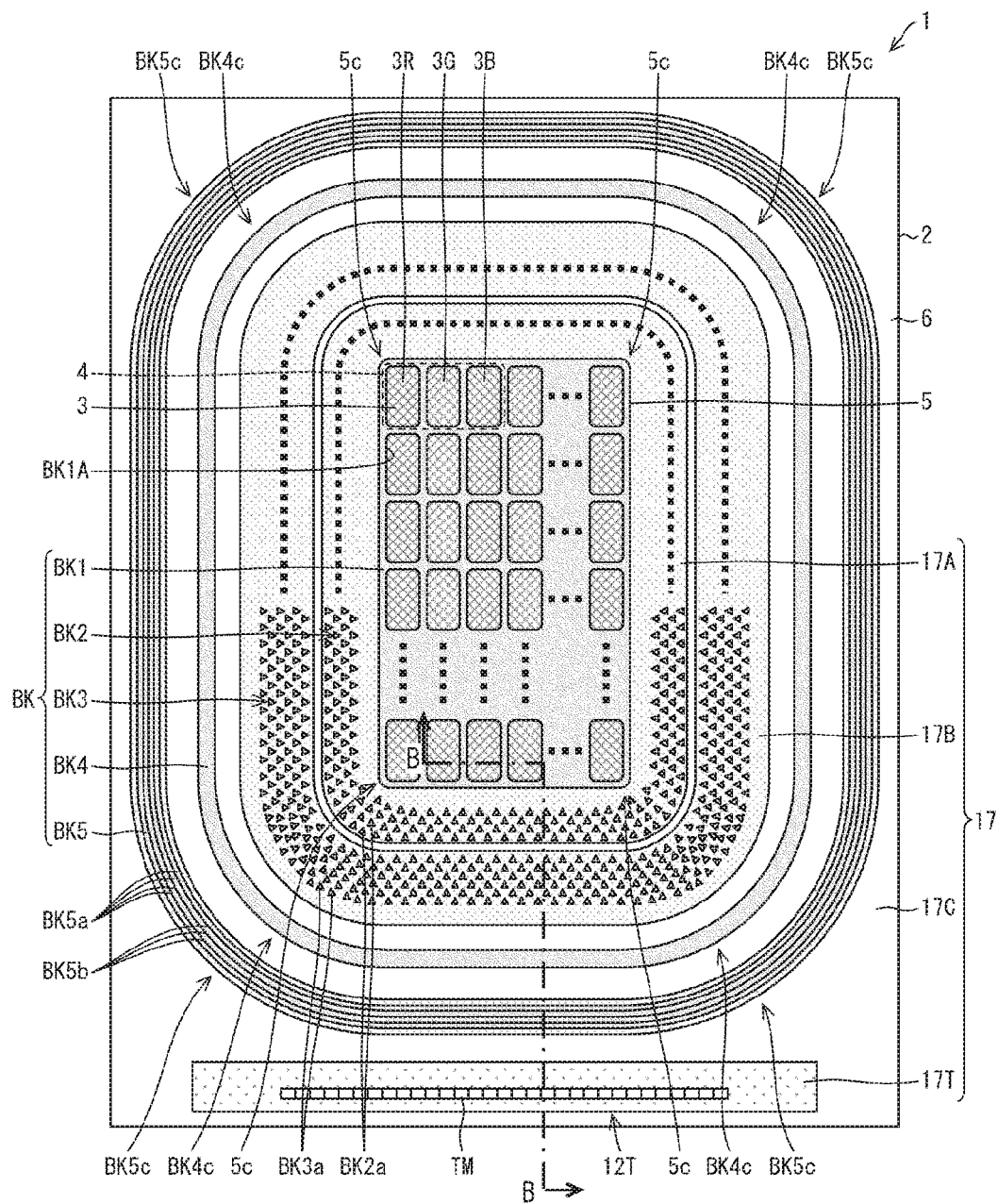
FIG. 9 is a plan view illustrating a schematic configuration of main portions of the organic EL display device according to the second embodiment of the disclosure.

A description follows regarding another embodiment of the disclosure, with reference mainly to FIGS. 8 and 9. The present embodiment will be described in terms of the differences between the present embodiment and the first embodiment, and components having the same function as the components described in the first embodiment are assigned the same reference signs, and a description thereof is omitted. Furthermore, the same modifications as those of the first embodiment can also be applied to the present embodiment.

Schematic Configuration of Organic EL Display Device

FIG. 8 is a cross sectional view illustrating an example of a schematic configuration of main portions of the organic EL display device 1 according to the present embodiment. FIG. 9 is a plan view illustrating a schematic configuration of main portions of the organic EL display device 1 according to the present embodiment. Note that FIG. 8 corresponds to a cross-sectional view seen in the direction of arrows on a line B-B in FIG. 9.

The organic EL display device 1 according to the present embodiment is the same as the organic EL display device 1 according to the first embodiment excepting the points described below.

The organic EL display device 1 according to the present embodiment is provided with a frame-shaped bank BK5 surrounding the frame-shaped bank BK4, on the outside of the frame-shaped bank BK4.

In the present embodiment, the frame-shaped bank BK2, the frame-shaped bank BK3, the frame-shaped bank BK4, and the frame-shaped bank BK5 are formed outside of the lattice-shaped bank BK1, and are provided in the above order from the inside to the outside with the lattice-shaped bank BK1 at the center.

The organic insulating film 17 includes the first organic insulating film pattern portion 17A formed extending from the display region 5 to part of the frame region 6, and, on the frame region 6, the second organic insulating film pattern portion 17B formed in the frame shape separated from the first organic insulating film pattern portion 17A and surrounding the first organic insulating film pattern portion 17A, a third organic insulating film pattern portion 17C formed in a frame shape separated from the second organic insulating film pattern portion 17B and surrounding the second organic insulating film pattern portion 17B, and the terminal portion organic insulating film pattern portion 17T covering the edge portions of the terminals TM.

Note that, similarly to the second organic insulating film pattern portion 17B, the TFTs 18 and the organic EL elements 24 are not provided on the third organic insulating film pattern portion 17C.

The bank BK5 is a back-up organic layer stopper (a second organic layer stopper) that defines the edges of the organic layer 32 by holding back the liquid organic material that has overflowed the bank BK4 that is the first organic layer stopper (main organic layer stopper).

The bank BK5 is provided on the frame-shaped third organic insulating film pattern portion 17C provided on the frame region 6.

The third organic insulating film pattern portion 17C on which the bank BK5 is provided is separated from the first organic insulating film pattern portion 17A, the second organic insulating film pattern portion 17B, and the bank BK4, and thus is used as a third dam portion DM3 that inhibits the infiltration of moisture into the TFTs 18 and the organic EL elements 24 inside the first organic insulating film pattern portion 17A.

Similar to the bank BK4, the bank BK5 is formed, not in a dot shape, but in the frame shape that is formed by a continuous line and surrounds the display region 5.

Similar to the first embodiment, in the present embodiment also, the first inorganic layer 31 is formed on the support body 11 over the entire surface of the display region 5 and the frame region 6, apart from the terminals TM, covering, in a plan view, the second electrode 23, the organic insulating film 17 apart from the part of the terminal portion 12T, the inorganic insulating film 15, and the banks BK that are not covered by the second electrode 23.

Thus, in the present embodiment, the first inorganic layer 31 covers part of the bank BK2, the bank BK3, the bank BK4, and the bank BK5 which are the banks BK that are not covered by the second electrode 23.

Furthermore, in the present embodiment, the second inorganic layer 33 covers the organic insulating film 17 apart from the part of the terminal portion 12T (more specifically, the first organic insulating film pattern portion 17A, the second organic insulating film pattern portion 17B, the third organic insulating film pattern portion 17C, and the edge portion of the terminal portion organic insulating film pattern portion 17T closer to the third organic insulating film pattern portion 17C), the organic EL element 24, the inorganic insulating film 15, and the banks BK1 to BK5 with at least the first inorganic layer 31, of the first inorganic layer 31 and the organic layer 32, interposed therebetween.

The organic EL display device 1 according to the first embodiment includes the recessed portions and the protrusions including the plurality of protrusions BK4a provided on the upper face of the bank BK4, and the protrusions BK4a have the planar portions on the upper faces thereof. However, the organic EL display device 1 according to the present embodiment does not include the recessed portions and the protrusions on the upper face of the bank BK4. In place of BK4, the organic EL display device 1 according to the present embodiment includes recessed portions and protrusions including a plurality of protrusions BK5a provided on the upper face of the bank BK5, and the protrusions BK5a have planar portions on the upper faces thereof.

In other words, the organic EL display device 1 illustrated in FIG. 8 includes recessed portions BK5b (groove portions) provided in the upper face of the bank BK5. In this way, the recessed portions and the protrusions including the plurality of protrusions BK5a having the planar portions (flat surfaces) on the upper face thereof are formed on the upper face of the bank BK5. The protrusions BK5a and the recessed portions BK5b on the upper face of the bank BK5 are each formed in the frame shape surrounding the bank BK4.

Note that, excepting the fact that the upper face of the bank BK4 of the organic EL display device 1 according to the present embodiment is a flat surface, and the recessed portions and the protrusions are not provided in the upper face thereof, the bank BK4 of the organic EL display device 1 according to the present embodiment is the same as the bank BK4 of the organic EL display device 1 according to the first embodiment.

In general, in a case where the liquid organic material overflows the first organic layer stopper (the main organic layer stopper), the organic layer may be exposed to the outside. This may lead to such a deterioration in the reliability of the display device that moisture or the like infiltrates from an exposed surface of the organic layer, a connection defect arises because of terminals covered by the organic layer, and the like. Thus, to eliminate the possibility of the wet-spreading of the liquid organic material flowing over a sealing region formed by the organic layer (namely, exceeding the allowable formation region of the organic layer), the back-up organic layer stopper is provided outside of the main organic layer stopper while surrounding the main organic layer stopper. However, in a case where the back-up organic layer stopper cannot hold back the liquid organic material either, and the liquid organic material overflows from the back-up organic layer stopper, the reliability of the display device may deteriorate. Meanwhile, in a case where a plurality of the back-up organic layer stoppers are provided in order to reliably hold back the liquid organic material, the frame region becomes accordingly larger and leads to an increase in the size of the device as a whole.

Here, in the present embodiment, instead of forming the plurality of back-up organic layer stoppers, the recessed portions and the protrusions including the plurality of protrusions BK5a having the planar portions on the upper face thereof are provided on the upper face of the bank BK5. The bank BK5 is the back-up organic layer stopper adjacent to the main organic layer stopper (namely, the second organic layer stopper directly adjacent to the first organic layer stopper). This allows the number of locations capable of holding back the liquid organic material to be increased and the liquid organic material to be held back more reliably, while a total area of an installation region of the bank functioning as the organic layer stopper can be reduced and frame narrowing can be achieved.

The protrusions BK5a and the recessed portions BK5b of the bank BK5 according to the present embodiment can be set in a similar manner to the protrusions BK4a and the recessed portions BK4b of the bank BK4 according to the first embodiment.

When the width in the short direction (namely, a direction orthogonal to the extension direction of the bank BK5) of the upper face of the protrusions BK5a (more specifically, the width of the planar portions of the upper faces of the protrusions BK5a) is denoted by D1, due to the same reasons as given for d1 above, D1 is preferably at least 15 μm. The upper limit thereof is not particularly limited to a specific value, but, due to the same reasons as given for d1 above, D1 is preferably 20 μm or less, for example.

Furthermore, when a width (a minimum distance) between the planes of the adjacent protrusions BK5a is denoted by D2, due to the same reasons as given for d2 above, D2 is preferably 5 μm or less (namely, $0 < D2 \leq 5$ μm).

Furthermore, due to the same reasons as given for the protrusions BK4a, the number of protrusions BK5a is more preferably within a range of 3 or greater and 5 or less.

Furthermore, due to the same reasons as given for d1 above, a total of the widths D1 of the bank BK5 is preferably 35 μm or greater, and is preferably 70 μm or less.

Note that, in the present embodiment, as described above, the bank BK5 is formed on the third organic insulating film pattern portion 17C, and thus, the third dam portion DM3 is formed to be higher than the bank BK4 that is the second dam portion DM2. In the present embodiment also, the height of the bank BK4 is set to be the same as in the first embodiment. Note that the height of the bank BK5 may have the same height as that of the bank BK4, for example.

In the present embodiment, when the height of the third dam portion DM3 is H1, H1 is not particularly limited to a specific value, but to prevent the bank BK4 and the third dam portion DM3 from coming into contact with the mask for vapor deposition used when forming the organic EL layer 22 or the like, H1 may be formed to be lower than the height h3 from the surface of the foundation layer (the uppermost layer passivation film) on which the organic insulating film 17 and the bank BK4 are provided to the respective faces of the high bank portion BK1b and the banks BK2 and BK3, which are the contact faces with the mask for vapor deposition. As an example, the H1 is formed to be 3.5 μm or greater (however, higher than the bank BK4), for example.

Furthermore, when the depth of the recessed portions BK5b (in other words, the height of the protrusions BK5a) is denoted by H2, due to the same reasons as given for h2 above, H2 is preferably 0.2 μm or greater, and due to the same reasons as given for h2 above, H2 is preferably 0.5 μm or less.

Furthermore, in the present embodiment also, the height h11 of the low bank portion BK1a and the height h12 of the high bank portion BK1b of the bank BK1, the height h21 of the bank BK2, and the height h31 of the bank BK3 are set to be the same as in the first embodiment.

Note that, in the present embodiment also, to improve coverage of a formation surface formed for each of the banks BK, a cross-section thereof is preferably a forwardly tapered shape.

Furthermore, in the present embodiment also, the first organic insulating film pattern portion 17A is preferably formed such that the straight line distance from each of the edge portions of the display region 5 to each of the inside side faces of the first organic insulating film pattern portion 17A facing each of the edge portions is constant. The second organic insulating film pattern portion 17B is preferably formed such that the straight line distance from each of the edge portions of the display region 5 to each of the inside side faces of the second organic insulating film pattern portion 17B facing each of the edge portions is constant. The bank BK4 is preferably formed such that the straight line distance from each of the edge portions of the display region 5 to each of the inside side faces of the bank BK4 facing each of the edge portions is constant.

Similarly, the bank BK5 is preferably formed such that a straight line distance from each of the edge portions of the display region 5 to each of inside side faces of the bank BK5 facing each of the edge portions is constant.

Note that, in the present embodiment also, since the display region 5 is formed in the quadrilateral shape, for example, as illustrated in FIG. 9, the outer shapes of the first organic insulating film pattern portion 17A, the second organic insulating film pattern portion 17B, the bank BK4, the third organic insulating film pattern portion 17C, and the bank BK5 formed on the third organic insulating film pattern portion 17C are also preferably formed in a quadrilateral shape having a substantially similar shape to that of the outer shape of the display region 5, and corner portions BK5c facing the corner portions 5c of the display region 5 are preferably formed to be curved. Note that, of course, in the present embodiment also, as described in the first embodiment, any desired shape can be adopted for the display region 5.

However, the present embodiment is not limited to this example, and the respective four corner portions of each of the first organic insulating film pattern portion 17A, the second organic insulating film pattern portion 17B, the third organic insulating film pattern portion 17C, and the banks BK4 and BK5 facing the corner portions 5c of the display region 5 may be curved lines as illustrated in FIG. 9, or may be right angles. In other words, the corner portions BK4c and BK5c of each of the banks BK4 and BK5 may have a curved frame shape (the corner portions may have an arc-shaped frame shape), or may have the right-angled four sided frame shape, for example, in which the corner portions BK4c and BK5c are the straight angled corners.

Production Method of Organic EL Display Device 1

The organic EL display device 1 according to the present embodiment can be produced by the same method as the production method of the organic EL display device 1 according to the first embodiment, excepting in that, in the patterning of the organic insulating film 17, the third organic insulating film pattern portion 17C is formed along with the first organic insulating film pattern portion 17A, the second organic insulating film pattern portion 17B, and the terminal portion organic insulating film pattern portion 17T, and, in the formation process of the banks BK, in place of forming the recessed portions and the protrusions in the bank BK4, the bank BK5 including the protrusions BK5a and recessed portions BK5b is formed on the third organic insulating film pattern portion 17C.

First Modified Example

Note that, in the present embodiment, as described above, in place of providing the recessed portions and the protrusions in the upper face of the bank BK4, the example is given in which the recessed portions and the protrusions are provided in the upper face of the bank BK5.

However, the present embodiment is not limited to this configuration, and, along with providing the protrusions BK4a and the recessed portions BK4b in the bank BK4, the protrusions BK5a and recessed portions BK5b may be provided in the bank BK5.

Second Modified Example

Furthermore, similarly to the protrusions BK4a of the bank BK4, the protrusions BK5a of the bank BK5 may be formed such that the further to the outside the protrusion BK5a is, the higher the height of the bank BK5.

Third Embodiment

A description follows regarding yet another embodiment of the disclosure, mainly with reference to FIGS. 10 to 13. The present embodiment will be described in terms of the differences between the present embodiment and the first and second embodiments, and components having the same function as the components described in the first and second embodiments are assigned the same reference signs, and a description thereof is omitted. Furthermore, the same modifications as those of the first and second embodiments can also be applied to the present embodiment.

Schematic Configuration of Organic EL Display Device

Figure 10:
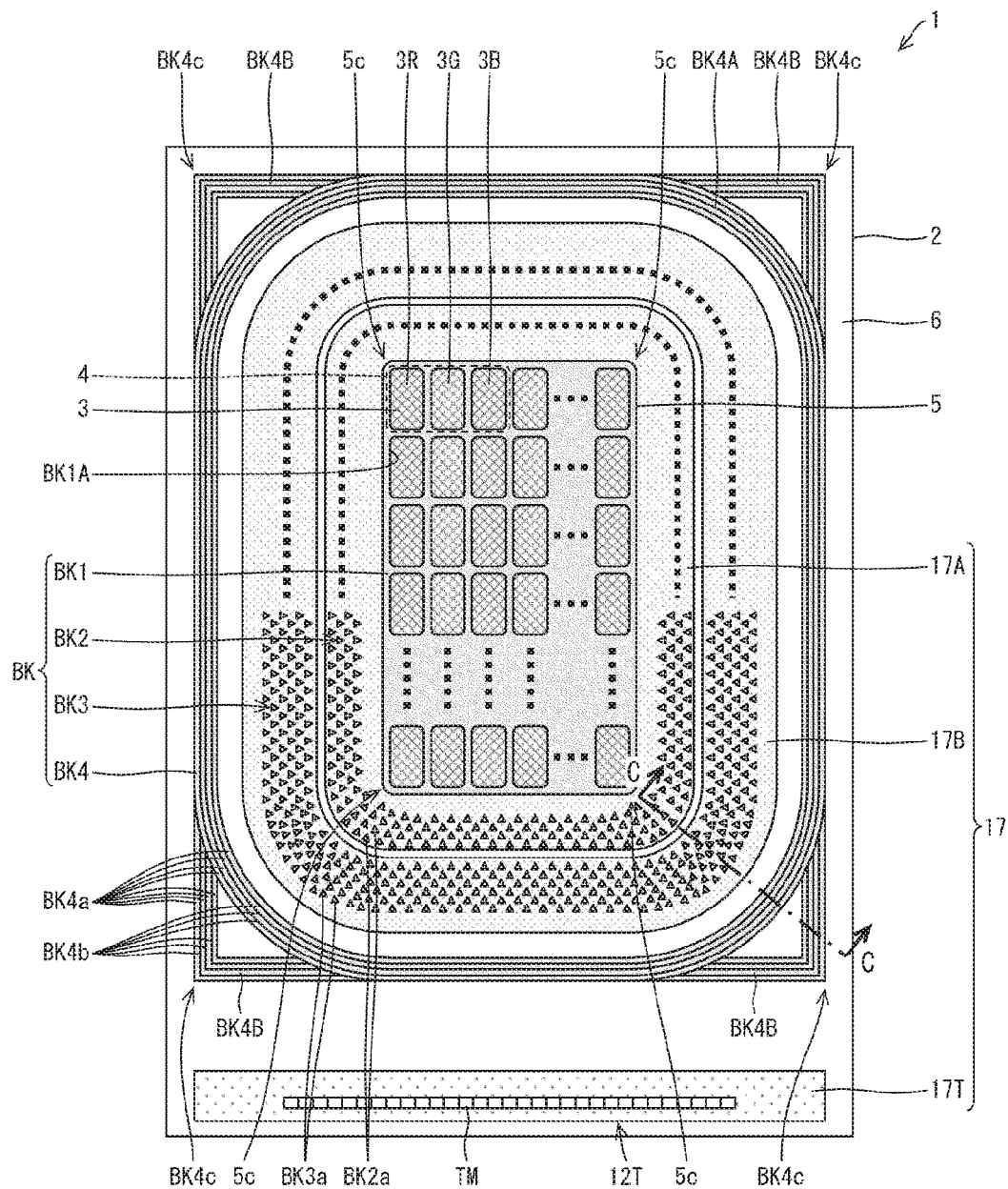
FIG. 10 is a plan view illustrating an example of a schematic configuration of main portions of the organic EL display device according to a third embodiment of the disclosure.
Figure 11:
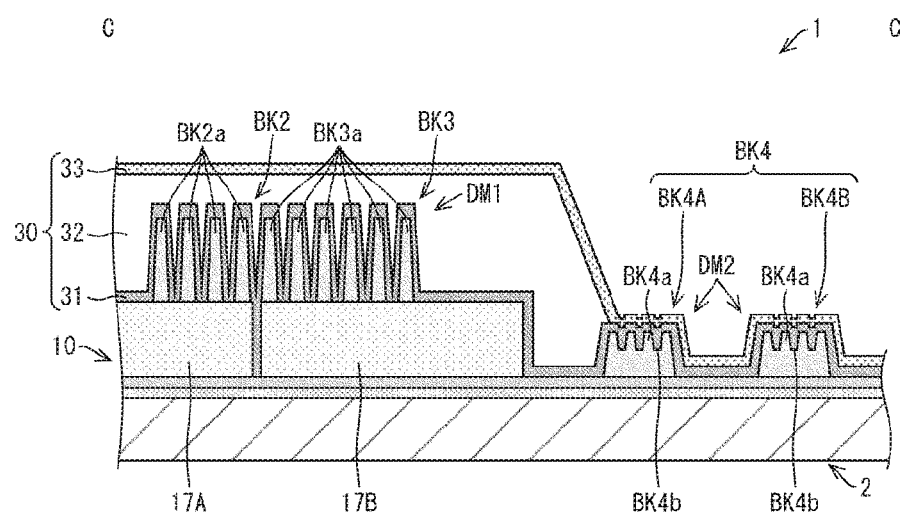
FIG. 11 is a cross-sectional view illustrating an example of a schematic configuration of main portions of the organic EL display device illustrated in FIG. 10.

FIG. 10 is a plan view illustrating an example of a schematic configuration of main portions of the organic EL display device 1 according to the present embodiment. FIG. 11 is a cross-sectional view illustrating an example of a schematic configuration of main portions of the organic EL display device 1 illustrated in FIG. 10. Note that FIG. 11 corresponds to a cross-sectional view seen in the direction of arrows on a line C-C in FIG. 10.

Figure 12:
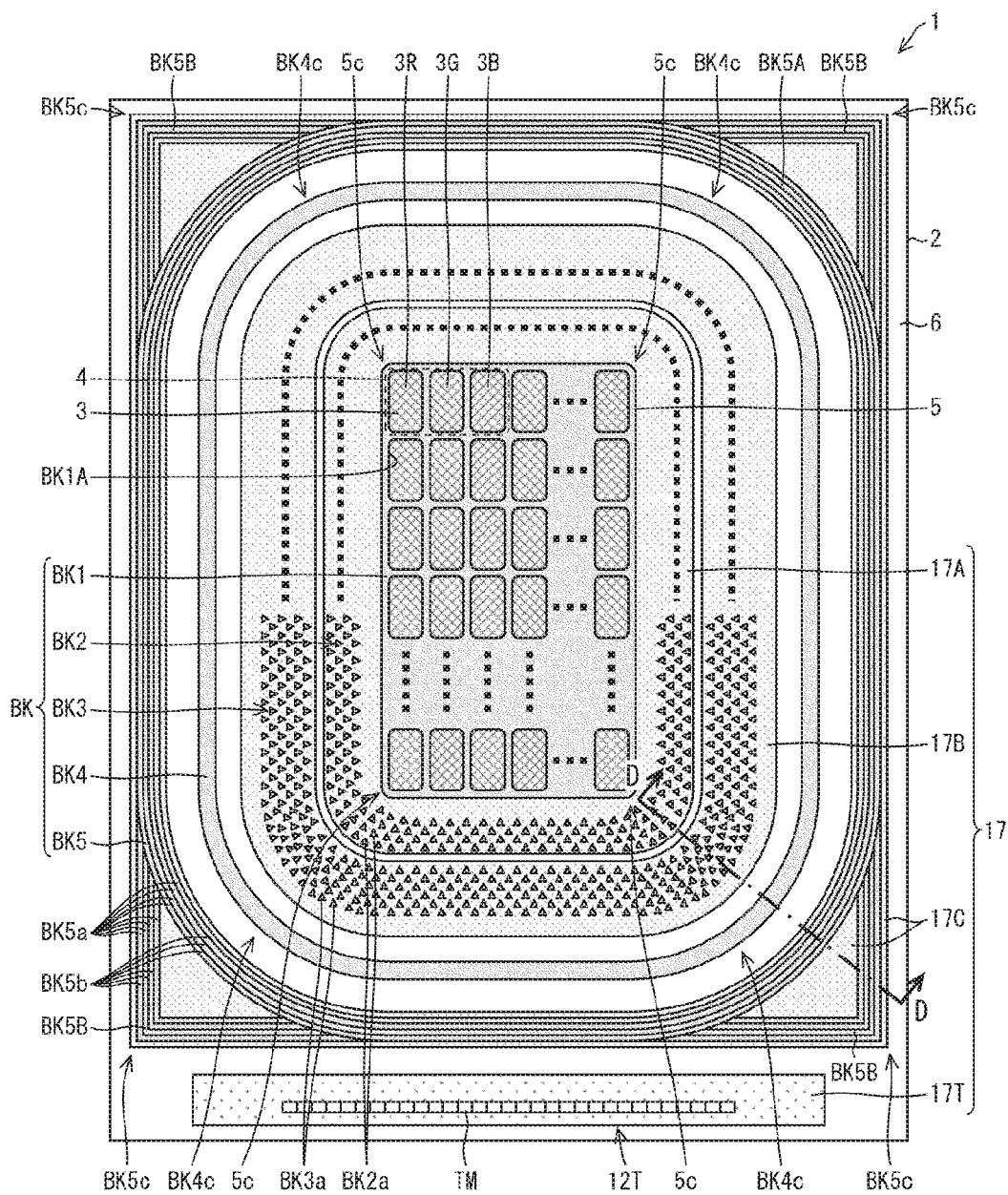
FIG. 12 is a plan view illustrating an example of a schematic configuration of main portions of another organic EL display device according to the third embodiment of the disclosure.
Figure 13:
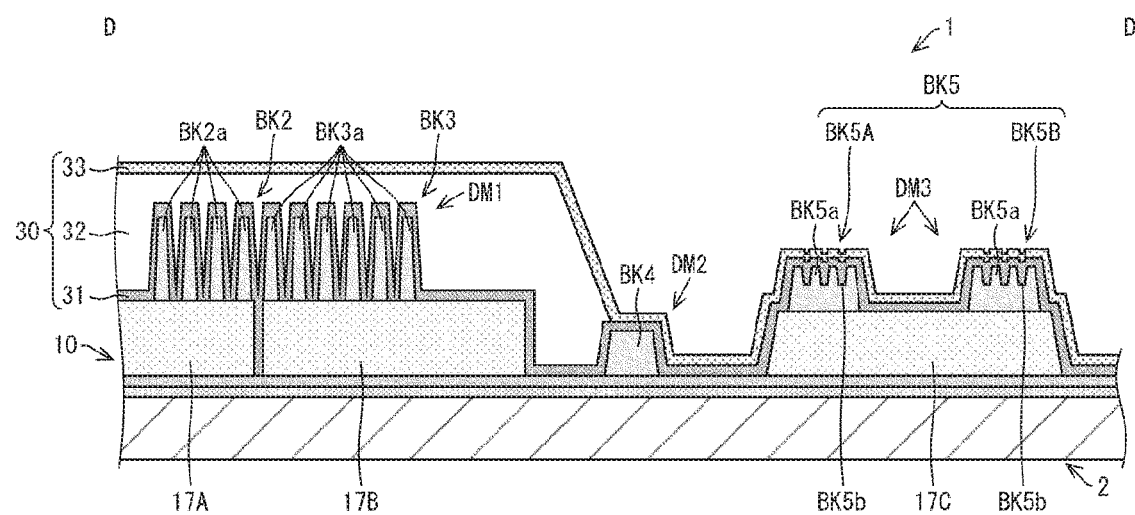
FIG. 13 is a cross-sectional view illustrating an example of a schematic configuration of main portions of the organic EL display device illustrated in FIG. 12.

Furthermore, FIG. 12 is a plan view illustrating an example of a schematic configuration of main portions of another organic EL display devices 1 according to the present embodiment. FIG. 13 is a cross-sectional view illustrating an example of a schematic configuration of main portions of the organic EL display device 1 illustrated in FIG. 12. Note that FIG. 13 corresponds to a cross-sectional view seen in the direction of arrows on a line D-D in FIG. 12.

The organic EL display device 1 illustrated in FIGS. 10 and 11 is the same as the organic EL display device 1 according to the first embodiment excepting the points described below. Furthermore, the organic EL display device 1 illustrated in FIGS. 12 and 13 is the same as the organic EL display device 1 according to the second embodiment excepting the points described below.

When the corner portions of the frame-shaped banks as the organic layer stoppers (the corner portions BK4c of the bank BK4, the corner portions BK5c of the bank BK5, for example) are caused to have a curvature (R), an advantage is obtained in that the straight line distance between each of the edge portions of the display region 5 and the frame-shaped banks facing each of the edge portions can be made constant. However, since the liquid organic material that becomes the organic sealing film flows into each of the corner portions of the frame-shaped banks in directions from positions around each of the corner portions toward each of the corner portions, the liquid organic material is concentrated in the corner portions. Thus, in a case where a width between the corner portions of the frame-shaped banks is narrow, the liquid organic material easily overflows at the corner portions. When the corner portions of the frame-shaped banks are arc-shaped, the width of the corner portions of the frame-shaped banks becomes narrower than when the corner portions of the frame-shaped banks are the straight angled corners.

Here, in the present embodiment, to eliminate the possibility of the liquid organic material that becomes the organic layer 32 overflowing the organic layer stoppers (the first organic layer stopper and the second organic layer stopper, for example), as illustrated in FIGS. 10 to 13, at least with respect to the frame-shaped bank furthermost to the outside (namely, the frame-shaped bank further from the display region 5) that is the final bastion to hold back the liquid organic material, the protrusions (the protrusions BK4a and BK5a, for example) are not formed in the upper face of the frame-shaped bank, and the frame-shaped bank itself is formed to have the double-frame shape at the corner portions only.

In the present embodiment, in a plan view, the frame-shaped bank that is furthermost to the outside has a first frame portion surrounding the display region 5 and including a plurality of corner portions, and a second frame portion contiguous to the first frame portion and surrounding each of the corner portions of the first frame portion. The second frame portion protrudes in an ear-like shape from the first frame portion at each of the corner portions of the first frame portion with a space between the second frame portion and each of the corner portions of the first frame portion, and an outer shape formed by the first frame portion and the second frame contiguous to the first frame portion is a double-frame shape having a polygonal frame shape.

Note that, in FIGS. 10 and 11, an example is given of a case in which, in a plan view, the bank BK4 is formed in the quadrilateral frame shape in which only the corner portions BK4c are formed in the double-frame shape. In FIGS. 12 and 13, an example is given of a case in which, in a plan view, the bank BK5 is formed in the quadrilateral frame shape in which only the corner portions BK5c are formed in the double-frame shape.

In other words, the organic EL display device 1 illustrated in FIGS. 10 and 11 includes the bank BK4 including a first frame portion BK4A as the first frame portion and a second frame portion BK4B as the second frame portion. The bank BK4 is formed in a double-frame shape in which the first frame portion BK4A that is the inside frame of the corner portions BK4c of the bank BK4 is arc-shaped and has curvature (namely, has curved portions), and the second frame portion BK4B that is the outside frame of the corner portions BK4c of the bank BK4 has straight angled portions (more specifically, is formed to have right angles). The protrusions BK4a and the recessed portions BK4b are formed on each of the first frame portion BK4A and the second frame portion BK4B.

Furthermore, the organic EL display device 1 illustrated in FIGS. 12 and 13 includes the bank BK5 including a first frame portion BK5A as the first frame portion and a second frame portion BK5B as the second frame portion. The bank BK5 is formed in the double-frame shape in which the first frame portion BK5A that is the inside frame of the corner portions BK5c of the bank BK5 is arc-shaped and has curvature (namely, has the curved portions), and the second frame portion BK5B that is the outside frame of the corner portions BK5c of the bank BK5 has straight angled portions (more specifically, is formed to have right angles). The protrusions BK5a and the recessed portions BK5b are formed on each of the first frame portion BK5A and the second frame portion BK5B.

Note that, as illustrated in FIGS. 10 to 13, the corner portions BK4c of the bank BK4 or the corner portions BK5c of the bank BK5 correspond to corner portions of the organic EL display device 1 (in other words, corner portions of the organic EL substrate 2).

According to the present embodiment, by forming the corner portions BK4c of the bank BK4 or the corner portions BK5c of the bank BK5 that is the organic layer stopper in the double-frame shape in this way, and thus obtaining a multi-barrier structure of two or more barriers, even when the corner portions BK4c of the frame-shaped bank BK4 or the corner portions BK5c of the bank BK5 are formed as the curved portions, the possibility can be eliminated that the liquid organic material that becomes the organic layer 32 overflows from the organic layer stoppers (the first organic layer stopper and the second organic layer stopper, for example).

Note that, in the present embodiment also, the heights h1 to h3, h11, h12, h21, h31, H1, and H2, and the widths d1, d2, D1, and D2 (refer to FIGS. 1 and 8) are set in the same manner as in the first and second embodiments. In the present embodiment also, to prevent the bank BK4 and the third dam portion DM3 from coming into contact with the mask for vapor deposition used when forming the organic EL layer 22 or the like, the height H1 of the third dam portion DM3 may be formed to be lower than the height h3 from the surface of the foundation layer (the uppermost layer passivation film) on which the organic insulating film 17 and the bank BK4 are provided to the respective faces of the high bank portion BK1b and the banks BK2 and BK3, which are the contact faces with the mask for vapor deposition.

The first frame portion BK4A and the second frame portion BK4B may be formed using the same material and in the same process, and may have the same height as each other. Furthermore, the protrusions BK4a and the recessed portions BK4b of the first frame portion BK4A, and the protrusions BK4a and the recessed portions BK4b of the second frame portion BK4B may have the same height and the same width, and the total of the widths d1 of the protrusions BK4a of the first frame portion BK4A may be the same as the total of the widths d1 of the protrusions BK4a of the second frame portion BK4B.

Similarly, the first frame portion BK5A and the second frame portion BK5B may be formed using the same material and in the same process, and may have the same height as each other. Furthermore, the protrusions BK5a and the recessed portions BK5b of the first frame portion BK5A, and the protrusions BK5a and the recessed portions BK5b of the second frame portion BK5B may have the same height and the same width, and the total of the widths D1 of the protrusions BK5a of the first frame portion BK5A may be the same as the total of the widths D1 of the protrusions BK5a of the second frame portion BK5B.

Note that, in FIGS. 12 and 13, the example is given of the case in which, of the banks BK4 and BK5 that are the organic layer stoppers, only the corner portions BK5c of the bank BK5 are formed in the double-frame shape. However, it goes without saying that the above-described possibility can be further eliminated by forming both the corner portions BK4c of the bank BK4 and the corner portions BK5c of the bank BK5 in the double-frame shape.

Production Method of Organic EL Display Device 1

Excepting that, in the formation process of the banks BK, the bank BK4 is formed such that only the corner portions BK4c are the double-frame shape formed from the first frame portion BK4A and second frame portion BK4B, the organic EL display device 1 illustrated in FIGS. 10 and 11 can be produced by the same method as the production method of the organic EL display device 1 according to the first embodiment.

Excepting that, in the patterning of the organic insulating film 17, the third organic insulating film pattern portion 17C is formed having the wider corner portions than other portions, so that the third organic insulating film pattern portion 17C can support the bank BK5 in which the corner portions BK5c have the double-frame shape, and, in the formation process of the banks BK, the bank BK5 is formed such that only the corner portions BK5c are the double-frame shape formed from the first frame portion BK5A and second frame portion BK5B, the organic EL display device 1 illustrated in FIGS. 12 and 13 can be produced by the same method as the production method of the organic EL display device 1 according to the second embodiment.

Fourth Embodiment

Figure 14:
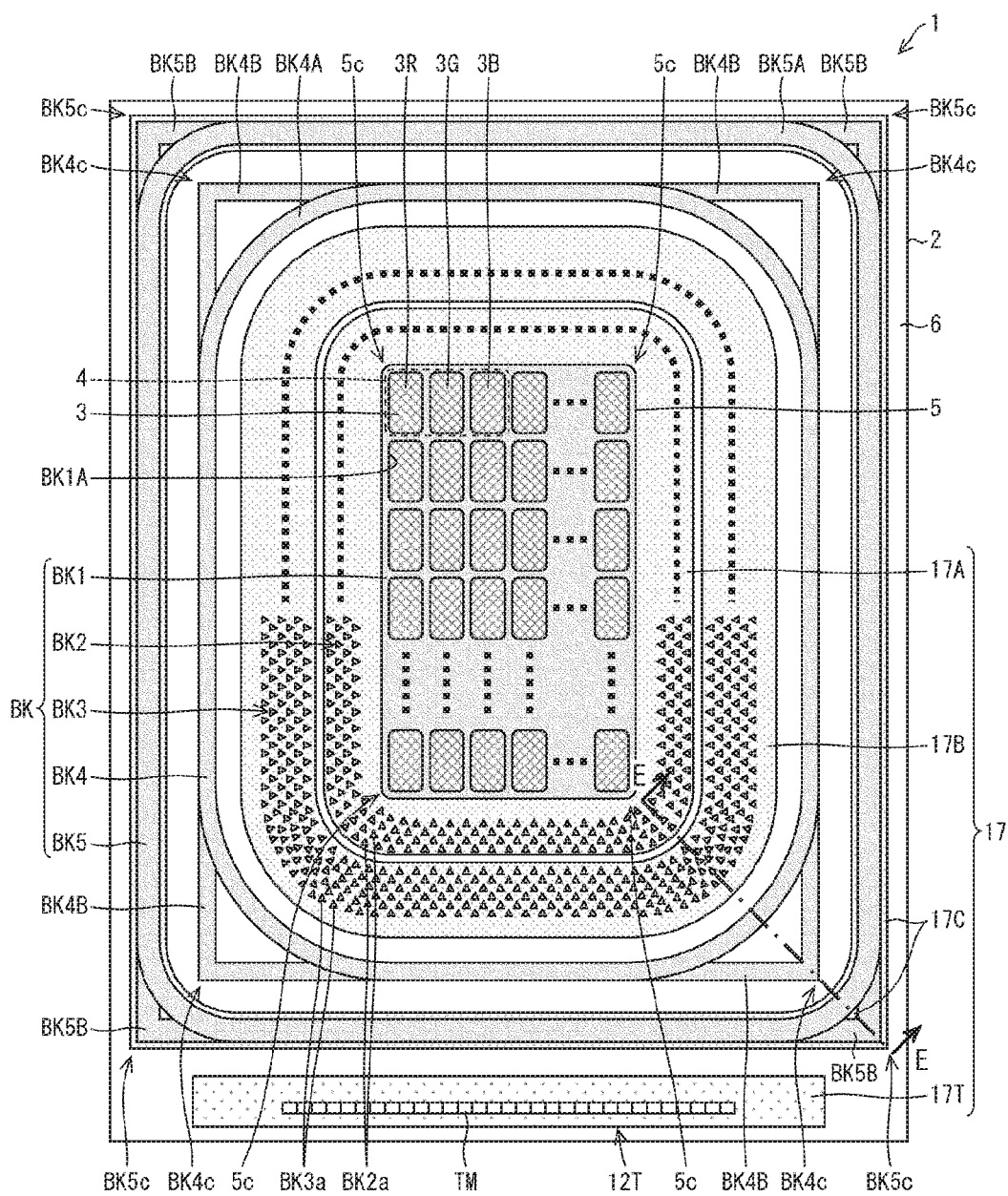
FIG. 14 is a plan view illustrating an example of a schematic configuration of main portions of the organic EL display device according to a fourth embodiment of the disclosure.
Figure 15:
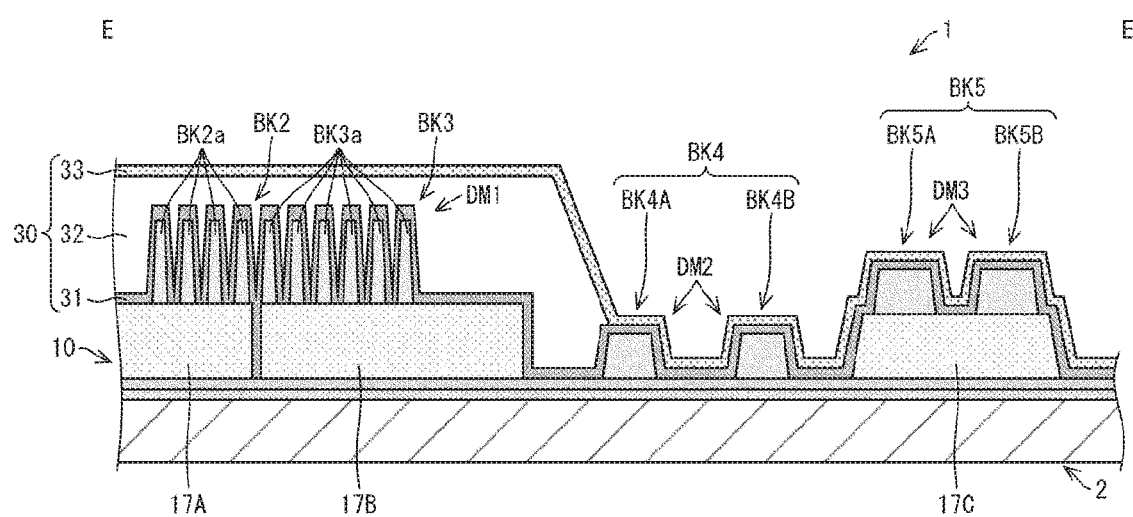
FIG. 15 is a cross-sectional view illustrating an example of a schematic configuration of main portions of the organic EL display device illustrated in FIG. 14.

A description follows regarding yet another embodiment of the disclosure, mainly with reference to FIGS. 14 and 15. The present embodiment will be described in terms of the differences between the present embodiment and the first to third embodiments, and components having the same function as the components described in the first to third embodiments are assigned the same reference signs, and a description thereof is omitted. Furthermore, the same modifications as those of the first to third embodiments can also be applied to the present embodiment.

Schematic Configuration of Organic EL Display Device

FIG. 14 is a plan view illustrating an example of a schematic configuration of main portions of the organic EL display device 1 according to the present embodiment. FIG. 15 is a cross-sectional view illustrating an example of a schematic configuration of main portions of the organic EL display device 1 illustrated in FIG. 14. Note that FIG. 15 corresponds to a cross-sectional view seen in the direction of arrows on a line E-E in FIG. 14.

As illustrated in FIGS. 14 and 15, in the organic EL display device 1 according to the present embodiment, the upper faces of the banks BK4 and BK5 that are the organic layer stoppers are flat, and, in addition to the fact that the recessed portions and the protrusions are not provided on the upper faces thereof, the corner portions BK4c of the bank BK4 and the corner portions BK5c of the bank BK5 are each formed in the double-frame shape. Excepting these points, the organic EL display device 1 according to the present embodiment is the same as the organic EL display device 1 according to the third embodiment illustrated in FIG. 11.

Note that, in the present embodiment, the recessed portions and the protrusions are not provided in the upper faces of the banks BK4 and BK5, as described above, but the heights h1, h3, h11, h12, h21, h31, and H1 (refer to FIGS. 1 and 7) are set in the same manner as in the first and second embodiments. In the present embodiment also, to prevent the bank BK4 and the third dam portion DM3 from coming into contact with the mask for vapor deposition used when forming the organic EL layer 22 or the like, the height H1 of the third dam portion DM3 may be formed to be lower than the height h3 from the surface of the foundation layer (the uppermost layer passivation film) on which the organic insulating film 17 and the bank BK4 are provided to the respective faces of the high bank portion BK1b and the banks BK2 and BK3, which are the contact faces with the mask for vapor deposition.

Furthermore, the first frame portion BK4A and the second frame portion BK4B may be formed using the same material and in the same process, and may have the same height as each other. Similarly, the first frame portion BK5A and the second frame portion BK5B may be formed using the same material and in the same process, and may have the same height as each other.

Production Method of Organic EL Display Device 1

Excepting that, in the formation process of the banks BK, the recessed portions and the protrusions are not formed in the bank BK5, and only the corner portions BK4c and BK5c of the banks BK4 and BK5 are formed in the double-frame shape, the organic EL display device 1 illustrated in FIGS. 14 and 15 can be produced by the same method as the production method of the organic EL display device 1 illustrated in FIGS. 12 and 13.

Advantageous Effects

As described above with reference to the third embodiment, the liquid organic material easily overflows at the corner portions of the frame-shaped banks that are the organic layer stoppers. According to the present embodiment, by forming, of the frame-shaped banks, only the corner portions at which the liquid organic material easily overflows in the double-frame shape, locations at which the liquid organic material is held back are increased at the corner portions in order to reliably hold back the liquid organic material. Furthermore, there is no need to form the plurality of back-up organic layer stoppers in order to hold back the liquid organic material that overflows from these corner portions, and the area of the installation region of the banks, which are the organic layer stoppers, can be reduced. As a result, the display device and the production method thereof can be provided that can achieve the frame narrowing.

Furthermore, according to the present embodiment, similarly to the third embodiment, by forming the corner portions BK4c and BK5c of the frame-shaped banks BK4 and BK5, which are the organic layer stoppers, in the double-frame shape, and thus obtaining the multi-barrier structure of two or more barriers that hold back the liquid organic material, irrespective of whether the corner portions BK4c and BK5c of the frame-shaped banks BK4 and BK5 are formed as the curved portions, the possibility can be eliminated that the liquid organic material that becomes the organic layer 32 overflows from the organic layer stoppers (the first organic layer stopper and the second organic layer stopper, for example). Furthermore, the inside frames of the corner portions BK4c and BK5c of the frame-shaped banks BK4 and BK5 have the curvature (namely, the curved portions), and thus, the straight line distance between each of the edge portions of the display region 5 and the frame-shaped bank BK4 facing each of the edge portions can be made constant, and the straight line distance between each of the edge portions of the display region 5 and the frame-shaped bank BK5 facing each of the edge portions can be made constant.

Fifth Embodiment

Figure 16:
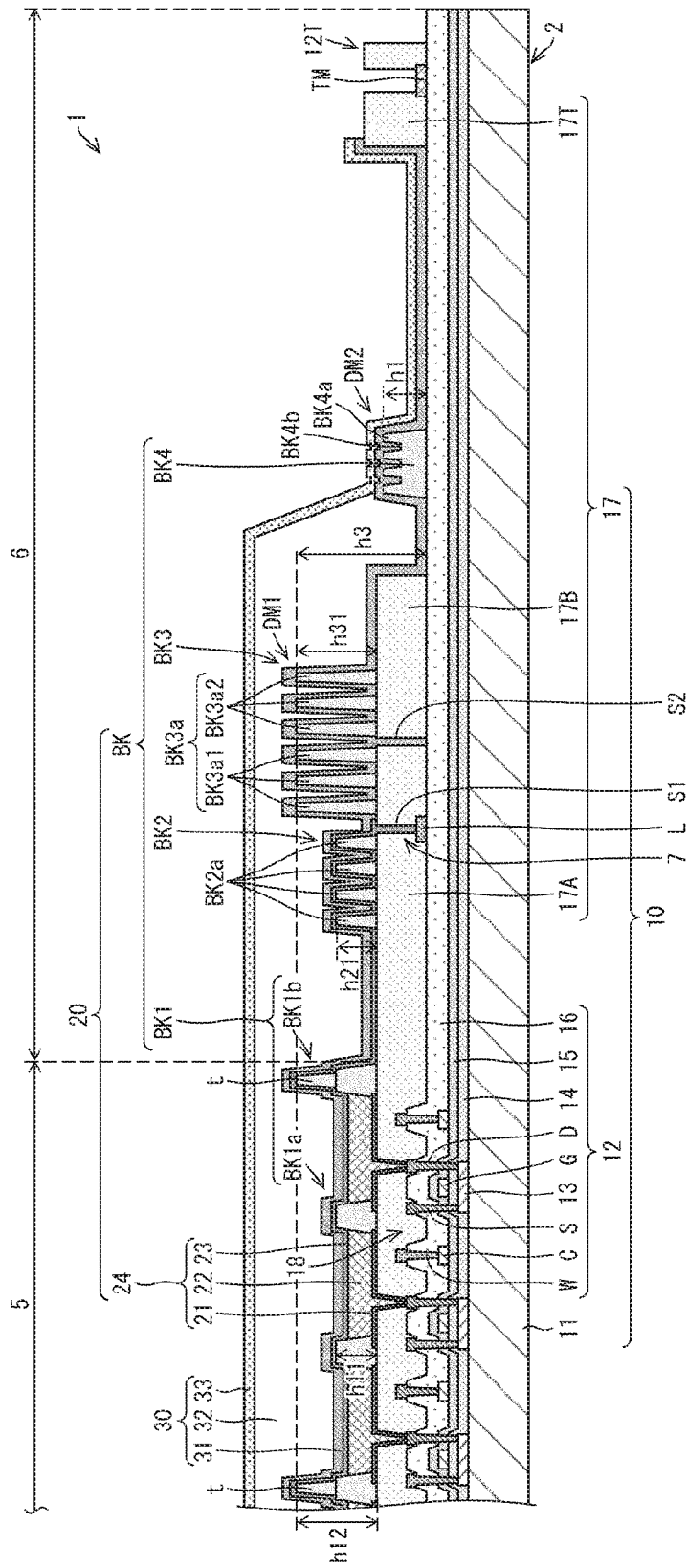
FIG. 16 is a cross-sectional view illustrating an example of a schematic configuration of main portions of the organic EL display device according to a fifth embodiment of the disclosure.
Figure 17:
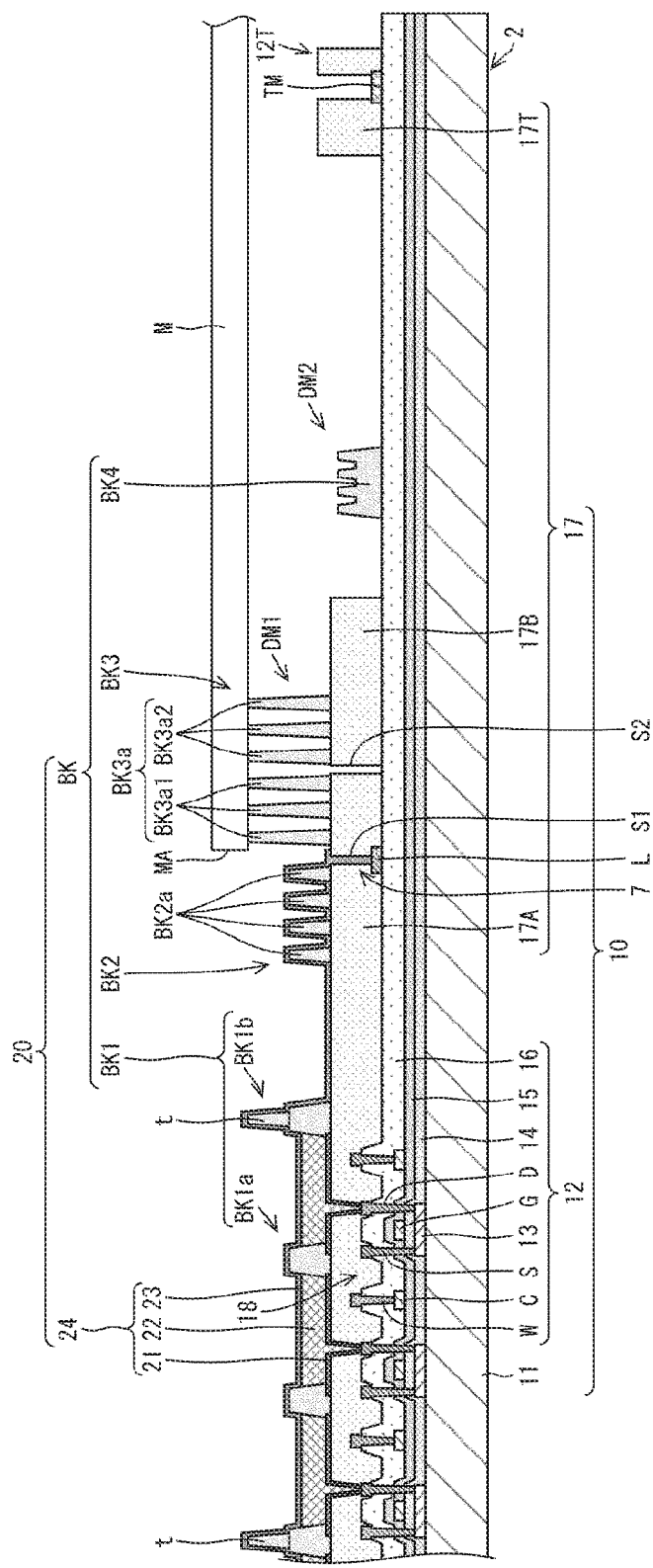
FIG. 17 is a cross-sectional view illustrating a vapor deposition process of a second electrode of the organic EL display device illustrated in FIG. 16.

A description follows regarding yet another embodiment of the disclosure, mainly with reference to FIGS. 16 and 17. The present embodiment will be described in terms of the differences between the present embodiment and the first to fourth embodiments, and components having the same function as the components described in the first to fourth embodiments are assigned the same reference signs, and a description thereof is omitted. Furthermore, the same modifications as those of the first to fourth embodiments can also be applied to the present embodiment.

FIG. 16 is a cross-sectional view illustrating an example of a schematic configuration of the organic EL display device 1 according to the present embodiment.

As illustrated in FIG. 16, on the inside of the bank BK4 (closer to the display region 5) and on the periphery of the display region 5 (namely, in a plan view, on the frame region 6 between the display region 5 and the bank BK4), the frame-shaped banks BK formed on the flattening film (the first organic insulating film pattern portion 17A and the second organic insulating film pattern portion 17B) include a first bank (hereinafter referred to as a "low bank") having a first height, and a second bank (hereinafter referred to as a "high bank") having a second height that is higher than the first height.

In an example illustrated in FIG. 16, the bank BK2 (the dot-shaped banks BK2a) is the low bank, and the bank BK3 (the dot-shaped banks BK3a) formed outside of the bank BK2 is the high bank. As illustrated in FIG. 16, the banks BK2 and BK3 are formed such that the height h31 of the bank BK3 is higher than the height h21 of the bank BK2.

A slit S1 (a first slit) is formed in the flattening film closer to the display region 5 than the bank BK3 that is the high bank. The slit S1 divides the flattening film (the organic insulating film 17) into the first organic insulating film pattern portion 17A and the second organic insulating film pattern portion 17B. Among the plurality of wiring lines formed on the TFT layer 12, a part of some of wiring lines L is exposed in the slit S1. The second electrode 23, which is the common electrode (common negative electrode) formed over the whole surface of the display region 5, is electrically connected to the wiring line L with the slit S1 interposed therebetween.

Furthermore, a slit S2 (a second slit) is preferably formed in the flattening film between the bank BK4 and the slit S1, and an interior of the slit S2 is preferably covered by the first inorganic layer 31. In this way, the slit S2 dividing the flattening film between the bank BK4 and the slit S1 in which the part of the wiring line L is exposed, can block a path of permeation of moisture into the slit S1, which can improve the reliability of the organic EL display device 1.

As described above in the first embodiment, the wiring line L may be the gate wiring line or the capacity wiring line, may be the source wiring line, or may be the other wiring line formed in the same layer as any of this wiring line (namely, formed in any of the first metal layer to the third metal layer).

In FIGS. 16 and 17, an example is illustrated of a case in which the inorganic insulating film 16 is provided as far as an end portion of the organic EL substrate 2 (namely, an end portion of the TFT substrate 10), and the wiring line L is the wiring line (the source wiring line, for example) disposed on the inorganic insulating film 16.

Thus, in the present embodiment also, as described with reference to FIG. 3 in the first embodiment, the second electrode connecting portion 7 that provides the electrical conductivity between the wiring line L and the second electrode 23 is formed, for example, surrounding the display region 5, apart from the part of the region between the terminal portion 12T and the display region 5. In the region between the terminal portion 12T and the display region 5, the lead-out wiring line for the wiring line such as the source wiring line is formed in the part of the region in which the second electrode connecting portion 7 is not formed.

FIG. 17 is a cross-sectional diagram illustrating a vapor deposition process of the second electrode 23 of the organic EL display device 1 illustrated in FIG. 16.

In the present embodiment, as illustrated in FIG. 16, the bank BK2 is the low bank, and, excepting that the height h21 is lower than the height h31 of the bank BK3, which is the high bank, and the height h12 of the high bank portion BK1b of the bank BK1 (where h31 is equal to h12) (namely, h21<h31=h12), the heights h1 to h3, h11, h12, h21, and h31, and the widths d1 and d2 (refer to FIG. 1) are set in the same way as in the first embodiment.

As illustrated in FIG. 17, in the vapor deposition of the second electrode 23, the vapor deposition is performed using, as a mask M for vapor deposition, an open mask having an opening MA on a formation region of the second electrode 23 (in other words, the whole of the display region 5), while the upper face of the bank BK3 is the contact face with the mask M (a placement surface for the mask M).

Note that, in FIG. 17, as an example of the vapor deposition process using the mask for vapor deposition, an example is illustrated of the vapor deposition process of the second electrode 23, but the present embodiment is not limited to this example. The upper face of the protrusion t and the upper face of the bank BK3 may be used as the contact faces for the mask for vapor deposition when the vapor deposition of the light emitting layer for each color is performed using the mask having openings corresponding to the sub pixels 3.

Furthermore, in the present embodiment, with reference to FIGS. 16 and 17, an example of a modified example of the organic EL display device 1 according to the first embodiment has been described, but it goes without saying that the same modification can be applied to the second to fourth embodiments in a similar manner.

Supplement

A display device (the organic EL display device 1) according to a first aspect of the disclosure includes: a plurality of optical elements (the organic EL elements 24); a sealing film (the sealing film 30) sealing the plurality of optical elements and including a first inorganic layer (the first inorganic layer 31), a second inorganic layer (the second inorganic layer 33), and an organic layer (the organic layer 32) provided between the first inorganic layer and the second inorganic layer; and at least one organic layer stopper formed from a frame-shaped bank (the bank BK4, the bank BK5, for example) surrounding a display region on which the plurality of optical elements are provided, and defining edges of the organic layer. The at least one organic layer stopper includes an organic layer stopper including recessed portions and protrusions on an upper face of the organic layer stopper, the recessed portions and protrusions including a plurality of protrusions (the protrusions BK4a, the protrusions BK5a, for example), each including a planar portion on an upper face of each of the plurality of protrusions.

With respect to the first aspect, in the display device according to a second aspect of the disclosure, one organic layer stopper of the at least one organic layer stopper may only be provided.

With respect to the second aspect, in the display device according to a third aspect of the disclosure, the at least one organic layer stopper may include a first frame portion (the first frame portion BK4A) surrounding the display region (the display region 5) in a plan view and including a plurality of corner portions (the corner portions BK4c), and a second frame portion (the second frame portion BK4B) contiguous to the first frame portion, surrounding each of the plurality of corner portions of the first frame portion, and protruding from the first frame portion at the plurality of corner portions of the first frame portion with a space between the second frame portion and each of the plurality of corner portions of the first frame portion.

With respect to the first aspect, in the display device according to a fourth aspect of the disclosure, the at least one organic layer stopper may include a first organic layer stopper (the bank BK4), and a second organic layer stopper (the bank BK5) provided outside of the first organic layer stopper, separated from the first organic layer stopper, and surrounding the first organic layer stopper. Of the first organic layer stopper and the second organic layer stopper, the recessed portions and the protrusions may be provided on at least the second organic layer stopper.

With respect to the fourth aspect, in the display device according to a fifth aspect of the disclosure, of the first organic layer stopper and the second organic layer stopper, at least the second organic layer stopper may include a first frame portion (the first frame portion BK4A, the first frame portion BK5A) surrounding the display region in a plan view and including a plurality of corner portions (the corner portions BK4c, the corner portions BK5c), and a second frame portion (the second frame portion BK4B, the second frame portion BK5B) contiguous to the first frame portion, surrounding each of the plurality of corner portions of the first frame portion, and protruding from the first frame portion at the plurality of corner portions of the first frame portion with a space between the second frame portion and each of the plurality of corner portions of the first frame portion.

A display device (the organic EL display device 1) according to a sixth aspect of the disclosure includes: a plurality of optical elements (the organic EL elements 24); a sealing film (the sealing film 30) sealing the plurality of optical elements and including a first inorganic layer (the first inorganic layer 31), a second inorganic layer (the second inorganic layer 33), and an organic layer (the organic layer 32) provided between the first inorganic layer and the second inorganic layer; and at least one organic layer stopper formed from a frame-shaped bank (the bank BK4, the bank BK5, for example) surrounding a display region (the display region 5) on which the plurality of optical elements are provided, and defining edges of the organic layer. The at least one organic layer stopper includes an organic layer stopper including a first frame portion (the first frame portion BK4A, the first frame portion BK5A) surrounding the display region in a plan view and including a plurality of corner portions (the corner portions BK4c, the corner portions BK5c), and a second frame portion (the second frame portions BK4B, the second frame portion BK5B) contiguous to the first frame portion, surrounding each of the plurality of corner portions of the first frame portion, and protruding from the first frame portion at the plurality of corner portions of the first frame portion with a space between the second frame portion and each of the plurality of corner portions of the first frame portion.

With respect to the sixth aspect, in the display device according to a seventh aspect of the disclosure, one organic layer stopper of the at least organic layer stopper may only be provided.

With respect to the seventh aspect, in the display device according to an eighth aspect of the disclosure, the at least one organic layer stopper may include a first organic layer stopper (the bank BK4), and a second organic layer stopper (the bank BK5) provided outside of the first organic layer stopper, separated from the first organic layer stopper and surrounding the first organic layer stopper. Of the first organic layer stopper and the second organic layer stopper, at least the second organic layer stopper may include the first frame portion and the second frame portion.

With respect to any one of the third aspect and the fifth to eighth aspects, in the display device according to a ninth aspect of the disclosure, in a plan view, the first frame portion may include curved portions at the plurality of corner portions, and the second frame portion may include straight angled portions provided outside of the curved portions and surrounding the curved portions.

With respect to any one of the third aspect and the fifth to ninth aspects, in the display device according to a tenth aspect of the disclosure, in the at least one organic layer stopper including the first frame portion and the second frame portion, the plurality of corner portions of the first frame portion are formed in an arc shape and only corner portions of the at least one organic layer stopper have an outer shape that is a polygonal frame shape formed in a double-frame shape formed by the first frame portion and the second frame portion.

With respect to any one of the third aspect and the fifth to tenth aspects, in the display device according to an eleventh aspect of the disclosure, an outer shape formed by the first frame portion and the second frame portion is a quadrilateral shape.

With respect to any one of the first to eleventh aspects, the display device according to a twelfth aspect of the disclosure may further include: a plurality of dot-shaped banks (the dot-shaped banks BK2a, the dot-shaped banks BK3a) provided between the display region and the at least one organic layer stopper, surrounding the display region, covered by the organic layer, and disposed in a plurality of rows in a frame shape while separated from the at least one organic layer stopper. Dot-shaped banks in adjacent rows of the plurality of dot-shaped banks may be disposed alternately with each other.

With respect to any one of the first to twelfth aspects, in the display device according to a thirteenth aspect of the disclosure, the plurality of optical elements may each include a first electrode (the first electrode 21), a second electrode (the second electrode 23), and a functional layer (the organic EL layer 22, for example) provided between the first electrode and the second electrode. Of the first electrode and the second electrode, the first electrode may be formed in island shapes. The display device may further include an edge cover (the bank BK1) provided on the display region, surrounding a peripheral portion of the first electrode, and the at least one organic layer stopper may be formed of a material identical to a material of the edge cover.

With respect to any one of the first to thirteenth aspects, the display device according to a fourteenth aspect of the disclosure may further include a driving element layer (the TFT layer 12) including a driving element (the TFT 18) configured to drive the plurality of optical elements, the driving element being formed in the driving element layer. The driving element layer may include an inorganic insulating film (a passivation film, such as the inorganic insulating film 15 or the inorganic insulating film 16, for example), and, of the at least one organic layer stopper, an organic layer stopper (the bank BK4) located closest to the display region may be directly formed on the inorganic insulating film.

With respect to any one of the first to eleventh aspects, the display device according to a fifteenth aspect of the disclosure may further include: a driving element layer (the TFT layer 12) including a plurality of driving elements (the TFTs 18) configured to drive the plurality of optical elements, a plurality of wiring lines, and a flattening film (the organic insulating film 17) covering the plurality of driving elements and the plurality of wiring lines, the plurality of driving elements, the plurality of wiring lines, and the flattening film being provided in the driving element layer. Each of the plurality of optical element may include a first electrode (the first electrode 21), a second electrode (the second electrode 23) and a functional layer (the organic EL layer 22, for example) provided between the first electrode and the second electrode, the second electrode being a common electrode common to the plurality of optical elements. The plurality of optical elements may be formed on the flattening film, and the display device may further include a plurality of frame-shaped banks (the bank BK2, the bank BK3) provided on the flattening film between the display region and the at least one organic layer stopper and surrounding the display region. The plurality of frame-shaped banks may include a first bank (the bank BK2, for example) having a first height and a second bank (the bank BK3, for example) having a second height higher than the first height. A first slit (the slit S1) may be formed in the flattening film closer to the display region than the second bank, a part of a wiring line (the wiring line L), of some of the plurality of wiring lines provided in the driving element layer, may be exposed in the first slit, and the second electrode may be electrically connected to the part of the wiring line with the first slit interposed between the second electrode and the part of the wiring line.

With respect to the fifteenth aspect, in the display device according to a sixteenth aspect of the disclosure, a second slit (the slit S2) may be formed in the flattening film between the at least one organic layer stopper and the first slit, and the second slit may be covered by the first inorganic layer.

With respect to the fifteenth or sixteenth aspects, in the display device according to a seventeenth aspect of the disclosure, each of the first bank and the second bank may include a plurality of dot-shaped banks (the dot-shaped banks BK2a, the dot-shaped banks BK3a) disposed in a plurality of rows in a frame shape, and dot-shaped banks in adjacent rows of the plurality of dot-shaped banks may be disposed alternately with each other.

With respect to any one of the fifteenth to seventeenth aspects, in the display device according to an eighteenth aspect of the disclosure, the first electrode may be formed in island shapes, the display device may further include an edge cover (the bank BK1) provided on the display region and surrounding a peripheral portion of the first electrode, and the at least one organic layer stopper may be formed of a material identical to a material of the edge cover.

With respect to any one of the fifteenth to eighteenth aspects, in the display device according to a nineteenth aspect of the disclosure, the driving element layer may include an inorganic insulating film (a passivation film, such as the inorganic insulating film 15 or the inorganic insulating film 16, for example). Of the at least one organic layer stopper, an organic layer stopper (the bank BK4) located closest to the display region may be directly formed on the inorganic insulating film.

A method for producing a display device (the organic EL display device 1) according to a twentieth aspect of the disclosure is a method for producing a display device including a plurality of optical elements (the organic EL elements 24), and a sealing film (the sealing film 30) sealing the plurality of optical elements and including a first inorganic layer (the first inorganic layer 31), a second inorganic layer (the second inorganic layer 33), and an organic layer (the organic layer 32) provided between the first inorganic layer and the second inorganic layer. The method includes: forming, as an organic layer stopper defining edges of the organic layer, at least one frame-shaped bank (the bank BK4, the bank BK5, for example) surrounding a display region (the display region 5) on which the plurality of optical elements are provided and including recessed portions and protrusions on an upper face of the at least one frame-shaped bank, the recessed portions and protrusions including a plurality of protrusions, each including a planar portion on an upper face of each of the plurality of protrusions, to hold back a liquid organic material that becomes the organic layer, using the at least one frame-shaped bank.

A method for producing a display device (the organic EL display device 1) according to a twenty-first aspect of the disclosure is a method for producing a display device including a plurality of optical elements (the organic EL elements 24) and a sealing film (the sealing film 30) sealing the plurality of optical elements and including a first inorganic layer (the first inorganic layer 31), a second inorganic layer (the second inorganic layer 33), and an organic layer (the organic layer 32) provided between the first inorganic layer and the second inorganic layer. The method includes: forming, as an organic layer stopper defining edges of the organic layer, at least one polygonal frame-shaped bank (the bank BK4, the bank BK5, for example) including corner portions, only the corner portions being formed in a double-frame shape, each of the corner portions including a first frame portion (the first frame portion BK4A, the first frame portion BK5A) surrounding, in a plan view, a display region (the display region 5) on which the plurality of optical elements are provided and including a plurality of corner portions (the corner portions BK4c, the corner portions BK5c), and a second frame portion (the second frame portion BK4B, the second frame portion BK5B) contiguous to the first frame portion, surrounding each of the plurality of corner portions of the first frame portion, and protruding from the first frame portion at the plurality of corner portions of the first frame portion with a space between the second frame portion and each of the plurality of corner portions of the first frame portion, to hold back a liquid organic material that becomes the organic layer, using the at least one polygonal frame-shaped bank.

The disclosure is not limited to each of the embodiments stated above, and various modifications may be implemented within a range not departing from the scope of the claims. Embodiments obtained by appropriately combining technical approaches stated in each of the different embodiments also fall within the scope of the technology of the disclosure. Moreover, novel technical features may be formed by combining the technical approaches stated in each of the embodiments.

REFERENCE SIGNS LIST

1 Organic EL display device
2 Organic EL substrate
3 Sub pixel
4 Pixel
5 Display region
6 Frame region
7 Second electrode connecting portion
10 TFT substrate
11 Support body
12 TFT layer
12T Terminal portion
13 Semiconductor layer
14 Gate insulating film
15, 16 Inorganic insulating film
17 Organic insulating film
17A First organic insulating film pattern portion
17B Second organic insulating film pattern portion
17C Third organic insulating film pattern portion
17T Terminal portion organic insulating film pattern portion
18 TFT
20 OLED layer
21 First electrode
22 Organic EL layer
23 Second electrode
24 Organic EL element (optical element)
30 Sealing film
31 First inorganic layer
32 Organic layer
33 Second inorganic layer
BK, BK1, BK2, BK3, BK4, BK4', BK5 Bank
BK2a, BK3a Dot-shaped bank
BK4a, BK5a Protrusion
BK4b, BK5b Recessed portion
BK4c, BK5c, 5c Corner portion
BK4A, BK5A First frame portion
BK4B, BK5B Second frame portion
S1, S2 Slit
L Wiring line

The invention claimed is:

1. A display device comprising:
a plurality of optical elements;
a sealing film sealing the plurality of optical elements and including a first inorganic layer, a second inorganic layer, and an organic layer provided between the first inorganic layer and the second inorganic layer; and
at least one organic layer stopper formed from a frame-shaped bank surrounding a display region on which the plurality of optical elements are provided, and defining edges of the organic layer,
wherein the at least one organic layer stopper includes an organic layer stopper including a first frame portion surrounding the display region in a plan view and including a plurality of corner portions, and a second frame portion contiguous to the first frame portion, surrounding each of the plurality of corner portions of the first frame portion, and protruding from the first frame portion at the plurality of corner portions of the first frame portion with a space between the second frame portion and each of the plurality of corner portions of the first frame portion.

2. The display device according to claim 1,
wherein only one organic layer stopper of the at least one organic layer stopper is provided.

3. The display device according to claim 2,
wherein the at least one organic layer stopper includes a first organic layer stopper and a second organic layer stopper provided outside of the first organic layer stopper, separated from the first organic layer stopper, and surrounding the first organic layer stopper, and
of the first organic layer stopper and the second organic layer stopper, at least the second organic layer stopper includes the first frame portion and the second frame portion.

4. The display device according to claim 1,
wherein, in a plan view, the first frame portion includes curved portions at the plurality of corner portions, and the second frame portion includes straight angled portions provided outside of the curved portions and surrounding the curved portions.

5. The display device according to claim 1,
wherein, in the at least one organic layer stopper including the first frame portion and the second frame portion, the plurality of corner portions of the first frame portion are formed in an arc shape, and only corner portions of the at least one organic layer stopper have an outer shape that is a polygonal frame shape formed in a double-frame shape formed by the first frame portion and the second frame portion.

6. The display device according to claim 1,
wherein an outer shape formed by the first frame portion and the second frame portion is a quadrilateral shape.

7. The display device according to claim 1, further comprising:
a plurality of dot-shaped banks provided between the display region and the at least one organic layer stopper, surrounding the display region, covered by the organic layer, and disposed in a plurality of rows in a frame shape while separated from the at least one organic layer stopper,
wherein dot-shaped banks in adjacent rows of the plurality of dot-shaped banks are disposed alternately with each other.

8. The display device according to claim 1,
wherein each of the plurality of optical elements includes a first electrode, a second electrode, and a functional layer provided between the first electrode and the second electrode,
the first electrode is formed in island shapes,
the display device further includes an edge cover provided on the display region and surrounding a peripheral portion of the first electrode, and
the at least one organic layer stopper is formed of a material identical to a material of the edge cover.

9. The display device according to claim 1, further comprising:
a driving element layer including a driving element configured to drive the plurality of optical elements, the driving element being formed in the driving element layer,
wherein the driving element layer includes an inorganic insulating film, and
of the at least one organic layer stopper, an organic layer stopper located closest to the display region is directly formed on the inorganic insulating film.

10. The display device according to claim 1, further comprising:
a driving element layer including a plurality of driving elements configured to drive the plurality of optical elements, a plurality of wiring lines, and a flattening film covering the plurality of driving elements and the plurality of wiring lines, the plurality of driving elements, the plurality of wiring lines, and the flattening film being provided in the driving element layer, wherein each of the plurality of optical elements includes a first electrode, a second electrode and a functional layer provided between the first electrode and the second electrode, the second electrode being a common electrode common to the plurality of optical elements, the plurality of optical elements are formed on the flattening film, the display device further includes a plurality of frame-shaped banks formed on the flattening film between the display region and the at least one organic layer stopper and surrounding the display region, the plurality of frame-shaped banks include a first bank having a first height and a second bank having a second height higher than the first height, a first slit is formed in the flattening film closer to the display region than the second bank, a part of a wiring line, of some of the plurality of wiring lines provided in the driving element layer, is exposed in the first slit, and the second electrode is electrically connected to the part of the wiring line with the first slit interposed between the second electrode and the part of the wiring line.

11. The display device according to claim 10, wherein a second slit is formed in the flattening film between the at least one organic layer stopper and the first slit, the second slit being covered by the first inorganic layer.

12. The display device according to claim 10, wherein each of the first bank and the second bank includes a plurality of dot-shaped banks disposed in a plurality of rows in a frame shape, dot-shaped banks in adjacent rows of the plurality of dot-shaped banks being disposed alternately with each other.

13. The display device according to claim 10, wherein the first electrode is formed in island shapes, the display device further includes an edge cover provided on the display region and surrounding a peripheral portion of the first electrode, and the at least one organic layer stopper is formed of a material identical to a material of the edge cover.

14. The display device according to claim 10, wherein the driving element layer includes an inorganic insulating film, and of the at least one organic layer stopper, an organic layer stopper located closest to the display region is directly formed on the inorganic insulating film.

15. A method for producing a display device including a plurality of optical elements, and a sealing film sealing the plurality of optical elements and including a first inorganic layer, a second inorganic layer, and an organic layer provided between the first inorganic layer and the second inorganic layer, the method comprising:

forming, as an organic layer stopper defining edges of the organic layer, at least one polygonal frame-shaped bank including corner portions, only the corner portions being formed in a double-frame shape, each of the corner portions including a first frame portion surrounding, in a plan view, a display region on which the plurality of optical elements are provided and including a plurality of corner portions, and a second frame portion contiguous to the first frame portion, surrounding each of the plurality of corner portions of the first frame portion, and protruding from the first frame portion at the plurality of corner portions of the first frame portion with a space between the second frame portion and each of the plurality of corner portions of the first frame portion, to hold back a liquid organic material that becomes the organic layer, using the at least one polygonal frame-shaped bank.

16. The display device according to claim 1, wherein the display device includes a plurality of optical elements, a sealing film sealing the plurality of optical elements and including a first inorganic layer, a second inorganic layer, and an organic layer provided between the first inorganic layer and the second inorganic layer, and at least one organic layer stopper formed from a frame-shaped bank surrounding a display region on which the plurality of optical elements are provided, and defining edges of the organic layer, the at least one organic layer stopper includes an organic layer stopper including recessed portions and protrusions on an upper face of the organic layer stopper, the recessed portions and protrusions including a plurality of protrusions, each including a planar portion on an upper face of each of the plurality of protrusions, one organic layer stopper of the at least one organic layer stopper is only provided, and the at least one organic layer stopper includes a first frame portion surrounding the display region in a plan view and including a plurality of corner portions and a second frame portion contiguous to the first frame portion, surrounding each of the plurality of corner portions of the first frame portion, and protruding from the first frame portion at the plurality of corner portions of the first frame portion with a space between the second frame portion and each of the plurality of corner portions of the first frame portion.

17. The display device according to claim 1, wherein the display device includes a plurality of optical elements, a sealing film sealing the plurality of optical elements and including a first inorganic layer, a second inorganic layer, and an organic layer provided between the first inorganic layer and the second inorganic layer, and at least one organic layer stopper formed from a frame-shaped bank surrounding a display region on which the plurality of optical elements are provided, and defining edges of the organic layer, the at least one organic layer stopper includes an organic layer stopper including recessed portions and protrusions on an upper face of the organic layer stopper, the recessed portions and protrusions including a plurality of protrusions, each including a planar portion on an upper face of each of the plurality of protrusions, the at least one organic layer stopper includes a first organic layer stopper and a second organic layer stopper provided outside of the first organic layer stopper, separated from the first organic layer stopper, and surrounding the first organic layer stopper, of the first organic layer stopper and the second organic layer stopper, the recessed portions and protrusions are provided on at least the second organic layer stopper, and of the first organic layer stopper and the second organic layer stopper, at least the second organic layer stopper includes a first frame portion surrounding the display region in a plan view and including a plurality of corner portions, and a second frame portion contiguous to the first frame portion, surrounding each of the plurality of corner portions of the first frame portion, and protruding from the first frame portion at the plurality of corner portions of the first frame portion with a space between the second frame portion and each of the plurality of corner portions of the first frame portion.

\* \* \* \* \*